(12) United States Patent
Kim

(10) Patent No.: US 12,342,481 B2
(45) Date of Patent: Jun. 24, 2025

(54) FOLDING DISPLAY DEVICE

(71) Applicant: SAMSUNG DISPLAY CO., LTD., Yongin-si (KR)

(72) Inventor: Se Bong Kim, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 221 days.

(21) Appl. No.: 18/165,472

(22) Filed: Feb. 7, 2023

(65) Prior Publication Data
US 2023/0269891 A1    Aug. 24, 2023

(30) Foreign Application Priority Data

Feb. 23, 2022   (KR) .......................... 10-2022-0023592

(51) Int. Cl.
*H05K 5/02*    (2006.01)
(52) U.S. Cl.
CPC .................. *H05K 5/0217* (2013.01)
(58) Field of Classification Search
CPC .... G06F 1/1652; G06F 1/1616; G06F 1/1681; G09F 9/301; G09F 9/335; G09F 9/33; H05K 5/0217
USPC ......................................................... 361/807
See application file for complete search history.

(56) References Cited

U.S. PATENT DOCUMENTS

| | | | |
|---|---|---|---|
| 9,572,272 B2 | 2/2017 | Lee | |
| 10,705,566 B2 | 7/2020 | Park | |
| 10,905,020 B2 * | 1/2021 | Jan | G02F 1/1333 |
| 10,948,947 B2 | 3/2021 | Yoon et al. | |
| 11,224,137 B2 * | 1/2022 | Hsu | E05D 3/18 |
| 2013/0120912 A1 | 5/2013 | Ladouceur et al. | |
| 2016/0334836 A1 * | 11/2016 | Hong | G06F 1/1681 |
| 2016/0364044 A1 * | 12/2016 | Kim | G06F 3/0445 |
| 2017/0062742 A1 * | 3/2017 | Kim | H10K 59/873 |
| 2017/0115701 A1 * | 4/2017 | Bae | G06F 1/16 |
| 2017/0192572 A1 * | 7/2017 | Han | H10K 59/40 |
| 2019/0166703 A1 * | 5/2019 | Kim | H04M 1/0268 |
| 2019/0200470 A1 * | 6/2019 | Woo | G06F 1/1679 |
| 2019/0391618 A1 * | 12/2019 | Hsu | G06F 1/1616 |

(Continued)

FOREIGN PATENT DOCUMENTS

| | | |
|---|---|---|
| KR | 10-1731375 | 4/2017 |
| KR | 10-1827970 | 2/2018 |

(Continued)

*Primary Examiner* — Timothy J Thompson
*Assistant Examiner* — Michael F McAllister
(74) *Attorney, Agent, or Firm* — F. CHAU & ASSOCIATES, LLC

(57) ABSTRACT

A display device includes a display module including a folding area that is configured to fold with respect to a folding axis that is substantially parallel to a first direction and first and second non-folding areas arranged in a second direction crossing the first direction with the folding area interposed therebetween. A first body is disposed under the first non-folding area. A second body is disposed under the second non-folding area. A center body is disposed under the folding area. A plurality of support plates extending in the first direction, arranged in the second direction, are disposed between the center body and the folding area and are rotatably coupled with each other. Lengths in the second direction of the support plates increase as a curvature of the folding area decreases.

20 Claims, 28 Drawing Sheets

(56) References Cited

U.S. PATENT DOCUMENTS

| | | | |
|---|---|---|---|
| 2020/0201400 A1* | 6/2020 | Jan | G06F 1/1652 |
| 2021/0325927 A1* | 10/2021 | Hsu | G06F 1/1616 |
| 2021/0333838 A1* | 10/2021 | Song | G06F 1/1652 |
| 2022/0068167 A1 | 3/2022 | Park et al. | |
| 2022/0129094 A1* | 4/2022 | Tatsuno | G06F 1/1641 |
| 2022/0210937 A1* | 6/2022 | Yun | H05K 5/0226 |

FOREIGN PATENT DOCUMENTS

| | | |
|---|---|---|
| KR | 1020190001864 | 1/2019 |
| KR | 10-2019-0098289 | 8/2019 |
| KR | 10-1988966 | 9/2019 |
| KR | 1020200051104 | 6/2020 |
| KR | 10-2021-0009476 | 1/2021 |
| KR | 10-2210047 | 2/2021 |
| KR | 10-2022-0027710 | 3/2022 |

\* cited by examiner

FOLDING DISPLAY DEVICE

CROSS-REFERENCE TO RELATED APPLICATION

This U.S. non-provisional patent application claims priority under 35 U.S.C. § 119 to Korean Patent Application No. 10-2022-0023592, filed on Feb. 23, 2022, the contents of which are hereby incorporated by reference in its entirety.

TECHNICAL FIELD

The present disclosure relates to a display device and, more particularly, to a folding display device.

DISCUSSION OF THE RELATED ART

Electronic devices that display an image to a user, such as a smart phone, a digital camera, a notebook computer, a navigation unit, and a smart television, include a display device to display the image. The display device generates the image and displays the image to the user through a display screen thereof.

There are various different types of display devices in use and in development. For example, various flexible display devices, which are foldable, rollable, or capable of being transformed into a curved shape, are being developed. These display devices may be repeatedly manipulated without breaking. The flexible display devices may make a device easier to carry, for a given size display screen.

Among the flexible display devices, a folding display device includes a display module that is foldable with respect to a folding axis extending in one direction. The display module is folded or unfolded with respect to the folding axis. The display module includes a folding area folded during a folding operation thereof. A support structure that easily supports and folds the folding area is also used.

SUMMARY

A display device includes a display module including a folding area that is foldable with respect to a folding axis that extends in a first direction and first and second non-folding areas extended in a second direction crossing the first direction with the folding area interposed therebetween. A first body is disposed under the first non-folding area, a second body is disposed under the second non-folding area, a center body is disposed under the folding area, and a plurality of support plates extending in the first direction, arranged in the second direction, are disposed between the center body and the folding area, and are rotatably coupled with each other. Lengths in the second direction of the support plates increase as a curvature of the folding area decreases.

A display device includes a display module including a folding area that is foldable with respect to a folding axis extending in a first direction and first and second non-folding areas arranged in a second direction crossing the first direction with the folding area interposed therebetween. A first body is disposed under the first non-folding area, a second body is disposed under the second non-folding area, a center body is disposed under the folding area, and a plurality of support plates extending in the first direction, arranged in the second direction, are disposed between the center body and the folding area, and are rotatably coupled with each other. A distance between rotation axes extending in the first direction and defined in both sides of each of the support plates, which are opposite to each other in the second direction, increases as a curvature of the folding area decreases.

A display device includes a display module including a folding area that is foldable with respect to a folding axis extending in a first direction and first and second non-folding areas arranged in a second direction crossing the first direction with the folding area interposed therebetween. A first body is disposed under the first non-folding area, a second body is disposed under the second non-folding area, a center body is disposed under the folding area, and a plurality of support plates extending in the first direction, are arranged in the second direction, disposed between the center body and the folding area, and are rotatably coupled with each other. Lengths in the second direction of the support plates are different from each other.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1:
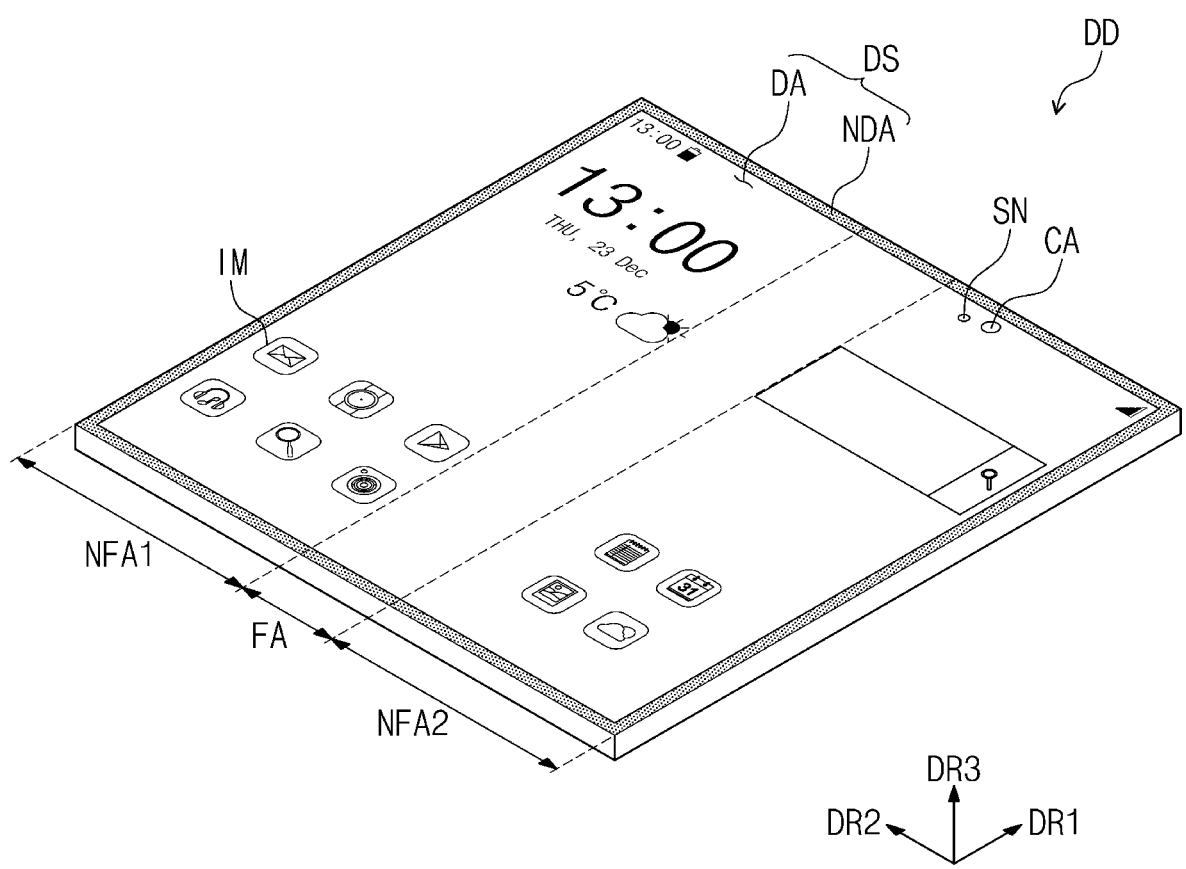
FIG. 1 is a perspective view of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals may refer to like elements throughout the specification and the drawings. In the drawings, the thickness, ratio, and dimension of components may be understood to represent, to scale, at least one embodiment of the present disclosure but these properties may be changed within the scope of the present disclosure. Thus, the present invention is not necessarily limited to the thicknesses, ratios, and dimensions shown in the drawings.

As used herein, the term "and/or" includes any and all combinations of one or more of the associated listed items.

It will be understood that, although the terms first, second, etc. may be used herein to describe various elements, these elements should not necessarily be limited by these terms. These terms are used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be described with reference to accompanying drawings.

Figure 2:
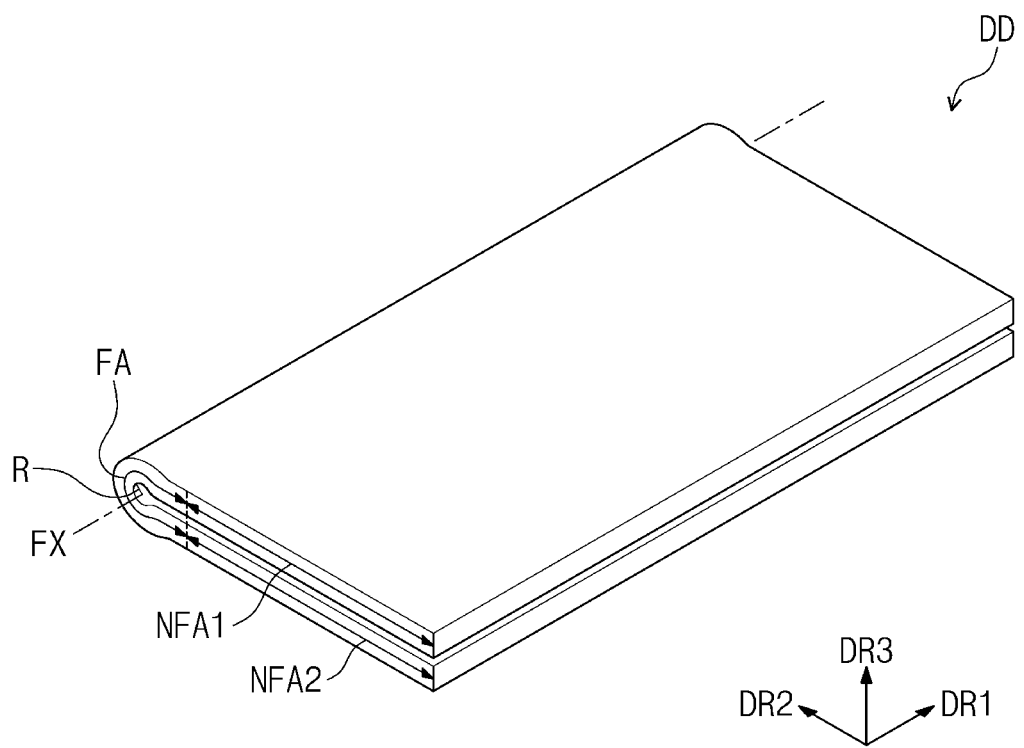
FIG. 2 is a perspective view of the display device shown in FIG. 1 while in a folded state.

FIG. 1 is a perspective view of a display device DD according to an embodiment of the present disclosure. FIG. 2 is a perspective view of the display device DD shown in FIG. 1, when in a folded state.

Referring to FIG. 1, the display device DD may have a substantially rectangular shape defined by a pair of long sides extending in a first direction DR1 and a pair of short sides extending in a second direction DR2 crossing the first direction DR1. However, the shape of the display device DD is not necessarily limited to the rectangular shape, and the display device DD may have various shapes, such as a circular shape and a polygonal shape. The display device DD may be a flexible display device.

Hereinafter, a direction substantially perpendicular to a plane defined by the first direction DR1 and the second direction DR2 may be referred to as a third direction DR3. In the present disclosure, the expression "when viewed in a plane" or "in a plan view" may mean a state of being viewed in the third direction DR3.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The second non-folding area NFA2, the folding area FA, and the first non-folding area NFA1 may be arranged in the second direction DR2.

In the present embodiment, one folding area FA and two non-folding areas NFA1 and NFA2 are shown as a representative example, however, the number of the folding areas FA and the number of non-folding areas NFA1 and NFA2 should not necessarily be limited thereto or thereby. As an example, the display device DD may include more than two non-folding areas and a plurality of folding areas disposed between the non-folding areas.

An upper surface of the display device DD may be referred to as a display surface DS, and the display surface DS may be a plane defined by the first direction DR1 and the second direction DR2. Images IM generated by the display device DD may be provided to a user through the display surface DS.

The display surface DS may include a display area DA and a non-display area NDA at least partially surrounding the display area DA. The display area DA may display the image, and the non-display area NDA might not display the image. The non-display area NDA may at least partially surround the display area DA and may define an edge of the display device DD, which is printed by a predetermined color.

The display device DD may include at least one sensor SN and at least one camera CA. The sensor SN and the camera CA may be disposed adjacent to the edge of the display device DD. The sensor SN and the camera CA may be disposed in the display area DA adjacent to the non-display area NDA. The sensor SN and the camera CA may be disposed in the second non-folding area NFA2, however, according to an embodiment, the sensor SN and the camera CA may be disposed in the first non-folding area NFA1.

Light may be provided to the camera CA and the sensor SN after passing through portions of the display device DD in which the sensor SN and the camera CA are disposed. As an example, the sensor SN may be a proximity illumination sensor, however, the sensor SN should not necessarily be particularly limited. The camera CA may take a picture of external objects. Each of the sensor SN and the camera CA may be provided in plural.

Referring to FIG. 2, the display device DD may be a foldable display device DD that is in a folded or an unfolded state. The folding area FA may be folded with respect to a folding axis FX that is substantially parallel to the first direction DR1, and thus, the display device DD may be folded. The folding axis FX may be defined as a major axis substantially parallel to the long sides of the display device DD.

When the display device DD is folded, the display device DD may be inwardly folded (in-folding) such that the first non-folding area NFA1 and the second non-folding area NFA2 may face each other and the display surface DS might not be exposed to the outside. However, the present disclosure should not necessarily be limited thereto or thereby. As an example, the display device DD may be outwardly folded (out-folding) with respect to the folding axis FX such that the display surface DS may be exposed to the outside.

A distance between the first non-folding area NFA1 and the second non-folding area NFA2 may be smaller than a radius of curvature R. Accordingly, the folding area FA may be folded into a dumbbell shape when viewed in the first direction DR1.

Figure 3:
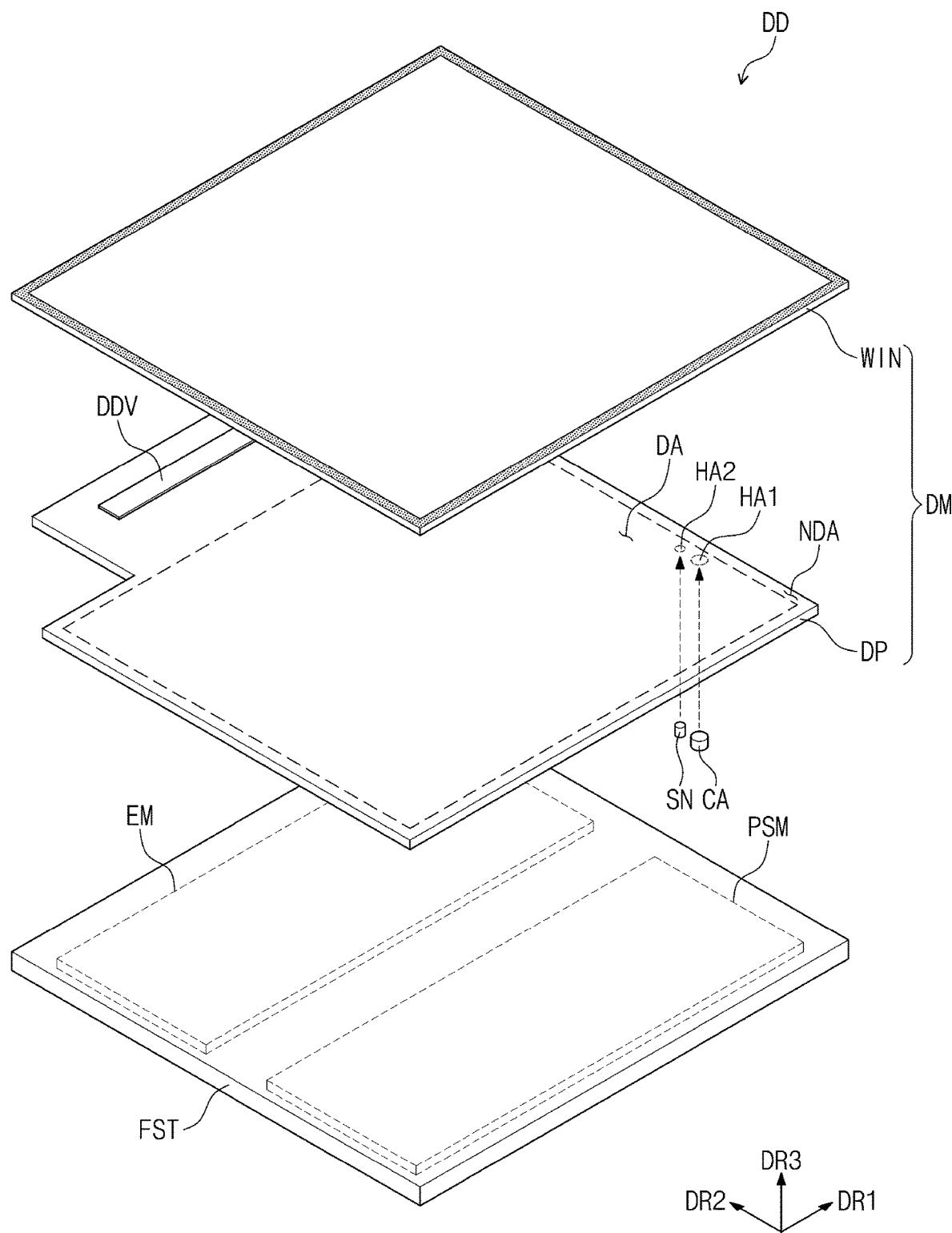
FIG. 3 is an exploded perspective view of a display device shown in FIG. 1.

FIG. 3 is an exploded perspective view of the display device DD shown in FIG. 1.

Referring to FIG. 3, the display device DD may include a display module DM, the camera CA, the sensor SN, an electronic module EM, a power module PSM, and a folding set FST.

The display module DM may generate an image and may sense an external input. The display module DM may include a display panel DP and a window WIN disposed on the display panel DP. The window WIN may protect the display panel DP. The window WIN may transmit light generated by the display panel DP to provide the light to a user.

The display panel DP may include a display area DA and a non-display area NDA, which respectively correspond to the display area DA (refer to FIG. 1) and the non-display area NDA (refer to FIG. 1) of the display device DD. In the present disclosure, the expression "an area/portion corresponds to another area/portion" means that "an area/portion overlaps another area/portion", but the expression should not necessarily be limited to "an area/portion has the same area and/or the same shape as another area/portion".

The display panel DP may be provided with a first hole area HA1 and a second hole area HA2, which are defined therethrough their respective areas. The first hole area HA1 and the second hole area HA2 may have a light transmittance that is higher than that of its surroundings. The camera CA may be disposed under the first hole area HAL and the sensor SN may be disposed under the second hole area HA2. The light may be provided to the camera CA and the sensor SN after passing through the first and second hole areas HA1 and HA2.

The display module DM may include a data driver DDV disposed in the non-display area NDA of the display panel DP. The data driver DDV may be manufactured in an integrated circuit chip form and may be mounted on the non-display area NDA, however, it should not necessarily be limited thereto or thereby. According to an embodiment, the data driver DDV may be mounted on a flexible circuit board connected to the display panel DP.

The folding set FST may be disposed under the display module DM. The folding set FST may accommodate the display module DM and may fold the display module DM. The structure of the folding set FST will be described in detail later.

The electronic module EM and the power module PSM may be accommodated in the folding set FST. The electronic module EM may control an operation of the display device DD. The power module PSM may supply a power to the electronic module EM.

Figure 4:
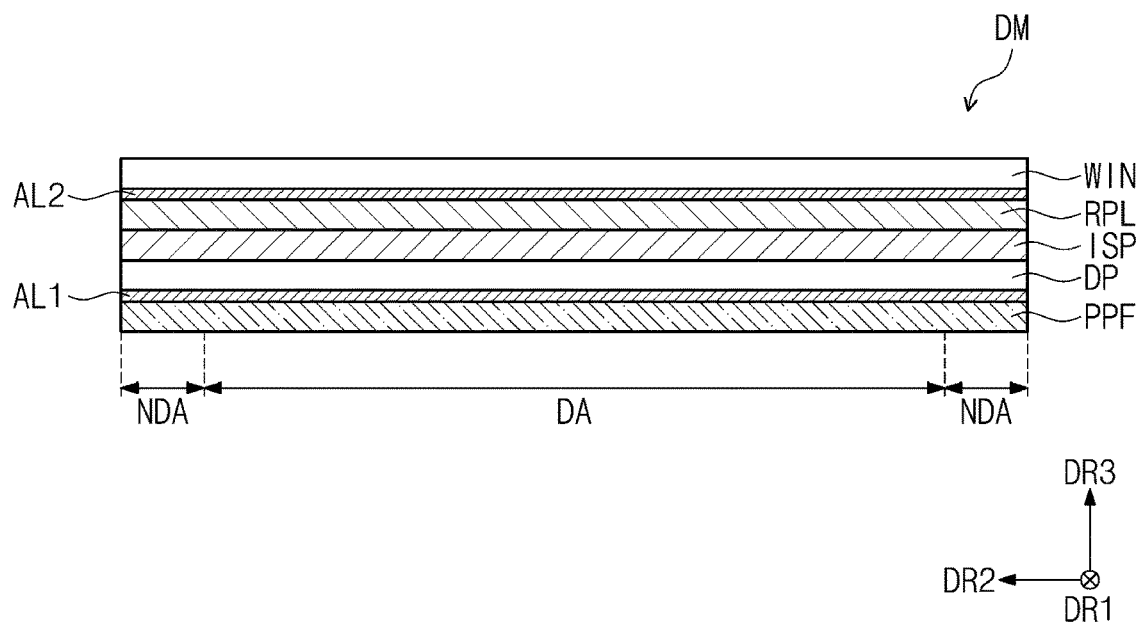
FIG. 4 is a cross-sectional view of a display module shown in FIG. 3.
Figure 5:
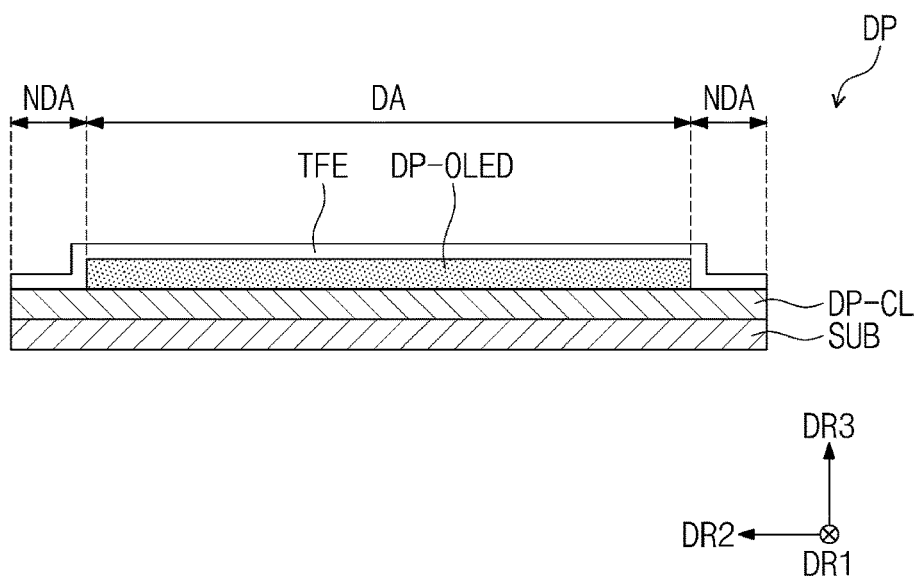
FIG. 5 is a cross-sectional view of a display panel shown in FIG. 4.

FIG. 4 is a cross-sectional view of the display module DM shown in FIG. 3. FIG. 5 is a cross-sectional view of the display panel DP shown in FIG. 4.

FIGS. 4 and 5 show cross-sections viewed in the first direction DR1.

Referring to FIG. 4, the display device DD may include the display panel DP, an input sensing part ISP, an anti-reflective layer RPL, the window WIN, a panel protective film PPF, and first and second adhesive layers AL1 and AL2.

The display panel DP may be a flexible display panel. According to an embodiment, the display panel DP may be a light emitting type display panel, however, it should not necessarily be limited thereto or thereby. As an example, the display panel DP may be an organic light emitting diode (OLED) display panel or an inorganic light emitting display panel. A light emitting layer of the organic light emitting diode display panel may include an organic light emitting material. A light emitting layer of the inorganic light emitting display panel may include a quantum dot or a quantum rod. Hereinafter, the organic light emitting diode display panel will be described as a representative example of the display panel DP.

The input sensing part ISP may be disposed on the display panel DP. The input sensing part ISP may include a plurality of sensors to sense an external input by a capacitive method. The input sensing part ISP may be directly manufactured on the display panel DP when the display device DD is manufactured, however, it should not necessarily be limited thereto or thereby. According to an embodiment, the input sensing part ISP may be attached to the display panel DP by an adhesive layer after being manufactured separately from the display panel DP.

The anti-reflective layer RPL may be disposed on the input sensing part ISP. The anti-reflective layer RPL may be directly formed on the input sensing part ISP when the display device DD is manufactured, however, it should not necessarily be limited thereto or thereby. The anti-reflective layer RPL may be attached to the input sensing part ISP by an adhesive layer after being manufactured separately.

The anti-reflective layer RPL may be defined as an external light reflection prevention film. The anti-reflective layer RPL may decrease a reflectance with respect to an external light incident to the display panel DP from the above of the display device DD.

In a case where the external light incident to the display panel DP is provided to the user after being reflected by the display panel DP, like a mirror, the user may perceive the external light. The anti-reflective layer RPL may include color filters that display the same colors as those of the pixels to prevent the above-mentioned phenomenon.

The color filters may filter the external light such that the external light may have the same color as the pixels. In this case, the external light might not be perceived by the user as its color matches that of the pixels near which it was reflected from. However, the present disclosure should not necessarily be limited thereto or thereby, and the anti-reflective layer RPL may include a polarizing film to reduce the reflectance with respect to the external light. The polarizing film may include a retarder and/or a polarizer.

The window WIN may be disposed on the anti-reflective layer RPL. The window WIN may protect the display panel DP, the input sensing part ISP, and the anti-reflective layer RPL from external scratches and impacts.

The panel protective film PPF may be disposed under the display panel DP. The panel protective film PPF may protect a lower portion of the display panel DP. The panel protective film PPF may include a flexible plastic material such as polyethyleneterephthalate (PET).

The first adhesive layer AL1 may be disposed between the display panel DP and the panel protective film PPF, and the display panel DP may be coupled with the panel protective film PPF by the first adhesive layer AL1. The second adhesive layer AL2 may be disposed between the window WIN and the anti-reflective layer RPL, and the window WIN may be coupled with the anti-reflective layer RPL by the second adhesive layer AL2.

Referring to FIG. 5, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display area DA and the non-display area NDA at least partially surrounding the display area DA. The substrate SUB may include glass or a flexible plastic material, e.g., polyimide (PI). The display element layer DP-OLED may be disposed in the display area DA.

A plurality of pixels may be disposed in the circuit element layer DP-CL and the display element layer DP-OLED. Each of the pixels may include a transistor disposed in the circuit element layer DP-CL and a light emitting element disposed in the display element layer DP-OLED and connected to the transistor.

The thin film encapsulation layer TFE may be disposed on the circuit element layer DP-CL and may cover the display element layer DP-OLED. The thin film encapsulation layer TFE may protect the pixels from moisture, oxygen, and foreign substances.

Figure 6:
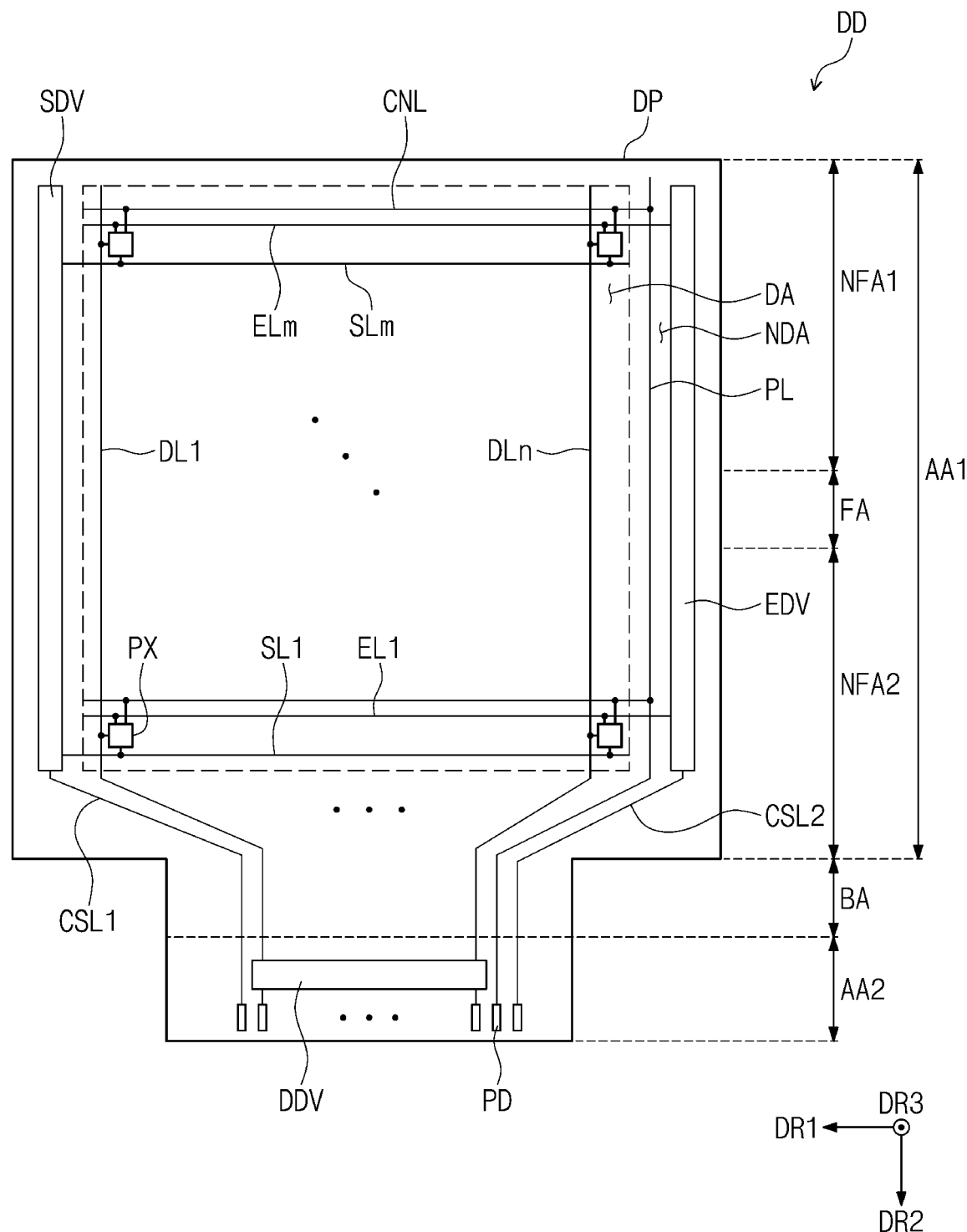
FIG. 6 is a plan view of a display panel shown in FIG. 5.

FIG. 6 is a plan view of the display panel DP shown in FIG. 5.

Referring to FIG. 6, the display device DD may include the display panel DP, a scan driver SDV, the data driver DDV, and an emission driver EDV.

The display panel DP may include a first area AA1, a second area AA2, and a bending area BA between the first area AA1 and the second area AA2. The bending area BA may extend in the first direction DR1, and the first area AA1, the bending area BA, and the second area AA2 may be arranged in the second direction DR2.

The first area AA1 may include the display area DA and the non-display area NDA at least partially surrounding the display area DA. The non-display area NDA may at least partially surround the display area DA. The display area DA may be an area in which the image is displayed, and the non-display area NDA may be an area in which the image is not displayed. The second area AA2 and the bending area BA may be areas in which the image is not displayed.

When viewed in the first direction DR1, the first area AA1 may include the first non-folding area NFA1, the second non-folding area NFA2, and the folding area FA between the first non-folding area NFA1 and the second non-folding area NFA2.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, a plurality of connection lines CNL, and a plurality of pads PD. Each of m and n is a positive integer. The pixels PX may be arranged in the display area DA and may be connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-display area NDA and may be respectively adjacent to both sides of the first area AA1, which are opposite to each other in the first direction DR1. The data driver DDV may be disposed in the second area AA2. The data driver DDV may be manufactured in an integrated circuit chip form and may be mounted on the second area AA2.

The scan lines SL1 to SLm may extend in the first direction DR1 and may be connected to the scan driver SDV. The data lines DL1 to DLn may extend in the second direction DR2 and may be connected to the data driver DDV via the bending area BA. The emission lines EL1 to ELm may extend in the first direction DR1 and may be connected to the emission driver EDV.

The power line PL may extend in the second direction DR2 and may be disposed in the non-display area NDA. The power line PL may be disposed between the display area DA and the emission driver EDV, however, it should not necessarily be limited thereto or thereby. According to an embodiment, the power line PL may be disposed between the display area DA and the scan driver SDV.

The power line PL may extend to the second area AA2 via the bending area BA. In a plan view, the power line PL may extend to a lower end of the second area AA2. The power line PL may receive a driving voltage.

The connection lines CNL may extend in the first direction DR1 and may be arranged in the second direction DR2. The connection lines CNL may be connected to the power line PL and the pixels PX. The driving voltage may be applied to the pixels PX via the power line PL and the connection lines CNL connected to the power line PL.

The first control line CSL1 may be connected to the scan driver SDV and may extend toward the lower end of the second area AA2 via the bending area BA. The second control line CSL2 may be connected to the emission driver EDV and may extend toward the lower end of the second area AA2 via the bending area BA. The data driver DDV may be disposed between the first control line CSL1 and the second control line CSL2.

In a plan view, the pads PD may be disposed adjacent to the lower end of the second area AA2. The data driver DDV, the power line PL, the first control line CSL1, and the second control line CSL2 may be connected to the pads PD.

The data lines DL1 to DLn may be connected to corresponding pads PD via the data driver DDV. As an example, the data lines DL1 to DLn may be connected to the data driver DDV, and the data driver DDV may be connected to the pads PD corresponding to the data lines DL1 to DLn.

A printed circuit board may be connected to the pads PD, and a timing controller and a voltage generator may be disposed on the printed circuit board. The timing controller and the voltage generator may be connected to the pads PD via the printed circuit board.

The timing controller may control an operation of the scan driver SDV, the data driver DDV, and the emission driver EDV. The timing controller may generate a scan control signal, a data control signal, and an emission control signal in response to control signals applied thereto from the outside. The voltage generator may generate the driving voltage.

The scan control signal may be applied to the scan driver SDV via the first control line CSL1. The emission control signal may be applied to the emission driver EDV via the second control line CSL2. The data control signal may be applied to the data driver DDV. The timing controller may receive image signals from an external source, may convert a data format of the image signals to a data format appropriate to an interface between the timing controller and the data driver DDV, and may provide the converted image signals to the data driver DDV.

The scan driver SDV may generate a plurality of scan signals in response to the scan control signal. The scan signals may be applied to the pixels PX via the scan lines SL1 to SLm. The scan signals may be sequentially applied to the pixels PX.

The data driver DDV may generate a plurality of data voltages corresponding to the image signals in response to the data control signal. The data voltages may be applied to the pixels PX via the data lines DL1 to DLn. The emission driver EDV may generate a plurality of emission signals in response to the emission control signal. The emission signals may be applied to the pixels PX via the emission lines EL1 to ELm.

The pixels PX may receive the data voltages in response to the scan signals. The pixels PX may emit light having a luminance corresponding to the data voltages in response to the emission signals, and thus, the image may be displayed. An emission time of the pixels PX may be controlled by the emission signals.

The bending area BA may be bent, and the second area AA2 may be disposed under the first area AA1. Accordingly, the data driver DDV may be disposed under the first area AA1 and might not be externally visible.

Figure 7:
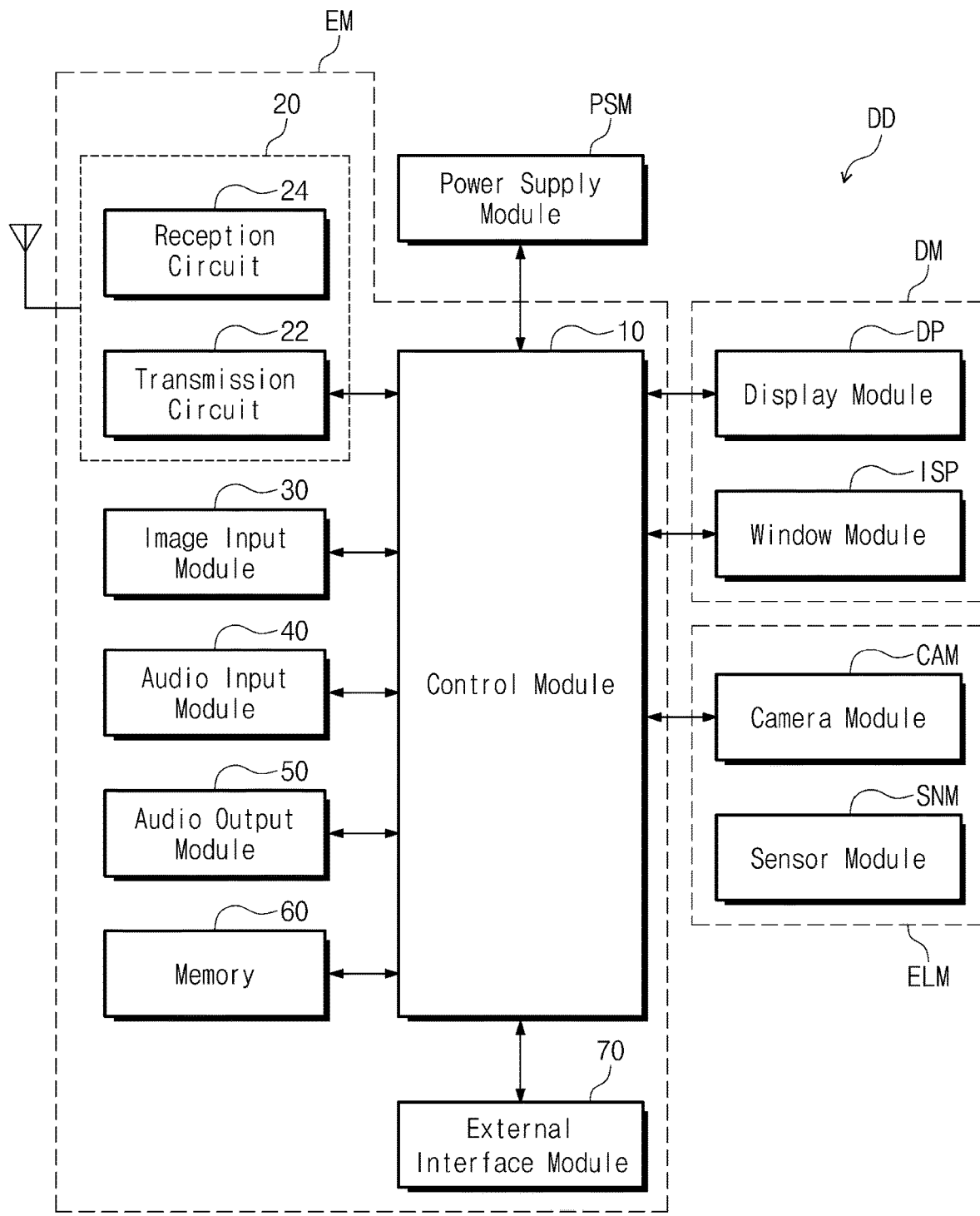
FIG. 7 is a block diagram of the display device shown in FIG. 3.

FIG. 7 is a block diagram of the display device DD shown in FIG. 3.

Referring to FIG. 7, the display device DD may include the electronic module EM, the power module PSM, the display module DM, and an electro-optical module ELM. The electronic module EM may include a control module 10, a wireless communication module 20, an image input module 30, an audio input module 40, an audio output module 50, a memory 60, and an external interface module 70. The modules 10, 20, 30, 40, 50, 60, and 70 may be mounted on a circuit board and may be electrically connected to each other or may be electrically connected to each other through a flexible circuit board. The electronic module EM may be electrically connected to the power module PSM.

The control module 10 may control an overall operation of the display device DD. For example, the control module 10 may activate or deactivate the display module DM in response to the user's input. The control module 10 may control other modules, such as the image input module 30, the audio input module 40, the audio output module 50, or the like, in response to the user's input. The control module 10 may include at least one microprocessor.

The wireless communication module 20 may transmit/receive a wireless signal to/from other terminals using a Bluetooth or WiFi link. The wireless communication module 20 may transmit/receive a voice signal using a general communication line. The wireless communication module 20 may include a transmission circuit 22 that modulates a signal to be transmitted and transmits the modulated signal and a reception circuit 24 that demodulates the signal applied thereto.

The image input module 30 may process an image signal and may convert the image signal into image data that may be displayed through the display device DD. The audio input module 40 may receive an external sound signal through a microphone in a record mode or a voice recognition mode and may convert the external sound signal to electrical voice data. The audio output module 50 may convert sound data provided thereto from the wireless communication module 20 or sound data stored in the memory 60 and may output the converted sound data.

The external interface module 70 may serve as an interface between the control module 10 and external devices, such as an external charger, a wired/wireless data port, a card socket (e.g., a memory card and a SIM/UIM card), etc.

The power module PSM may supply a power required for the overall operation of the display device DD. The power module PSM may include a conventional battery device.

The electro-optical module ELM may be an electronic component that transmits or receives the optical signal. The electro-optical module ELM may transmit or receive the optical signal through an area of the display module DM. In the present embodiment, the electro-optical module ELM may include a camera module CAM and a sensor module SNM. The camera module CAM may include the camera CA shown in FIG. 3. The sensor module SNM may include the sensor SN shown in FIG. 3.

Figure 8:
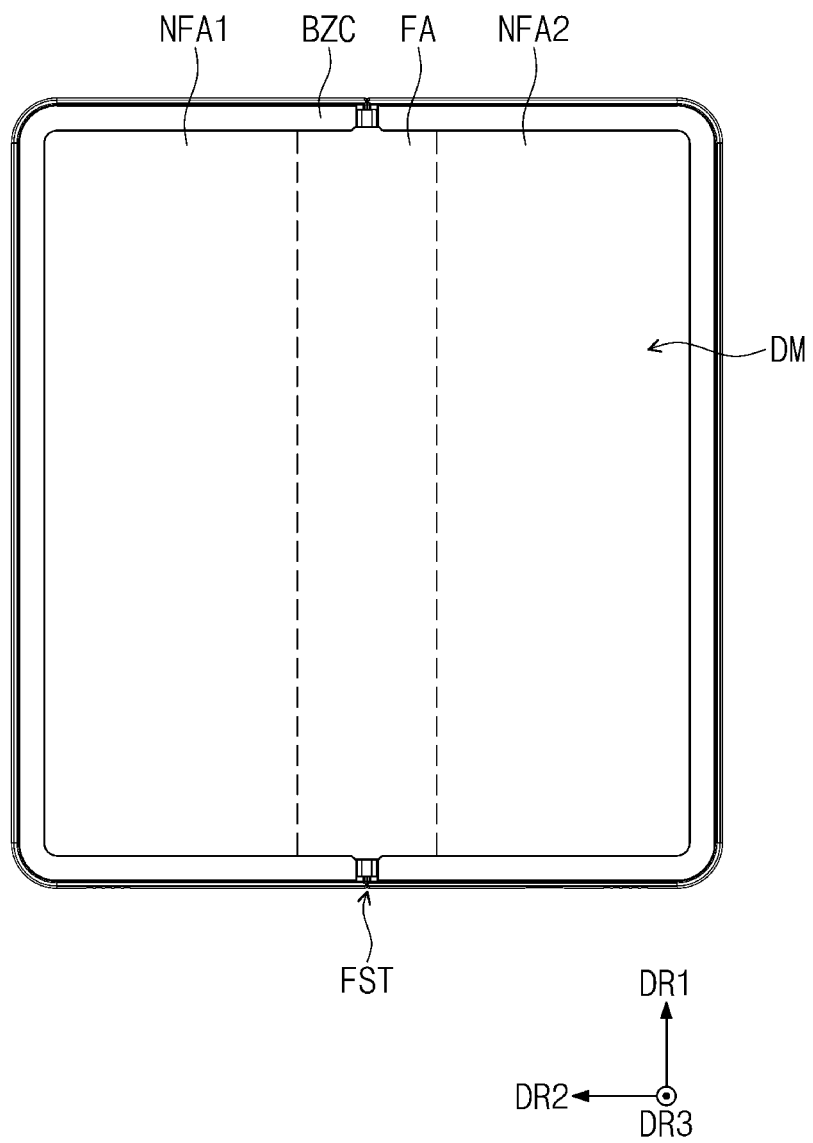
FIG. 8 is a plan view of the display device shown in FIG. 1.
Figure 9:
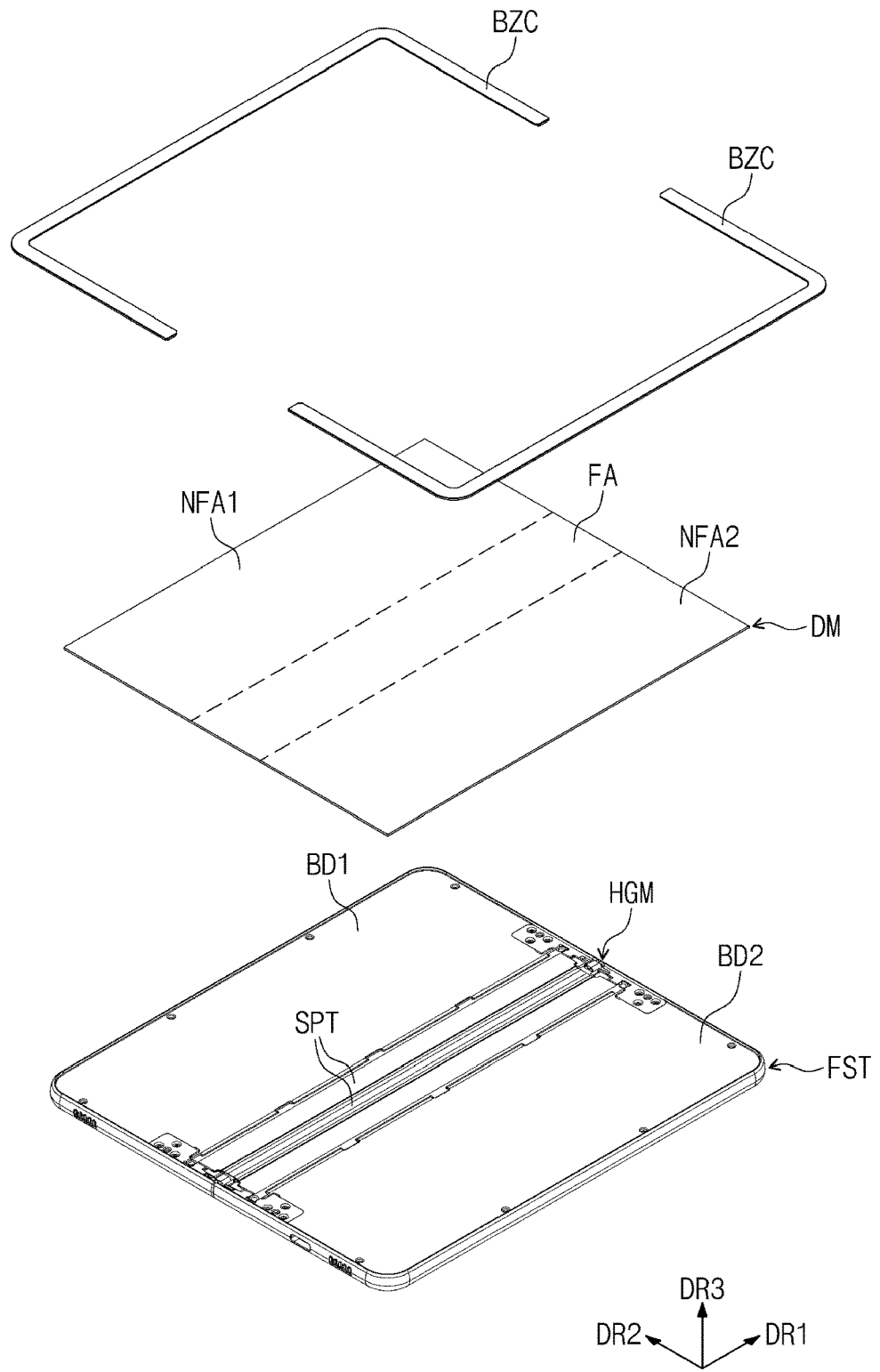
FIG. 9 is an exploded perspective view of the display device shown in FIG. 8.
Figure 10:
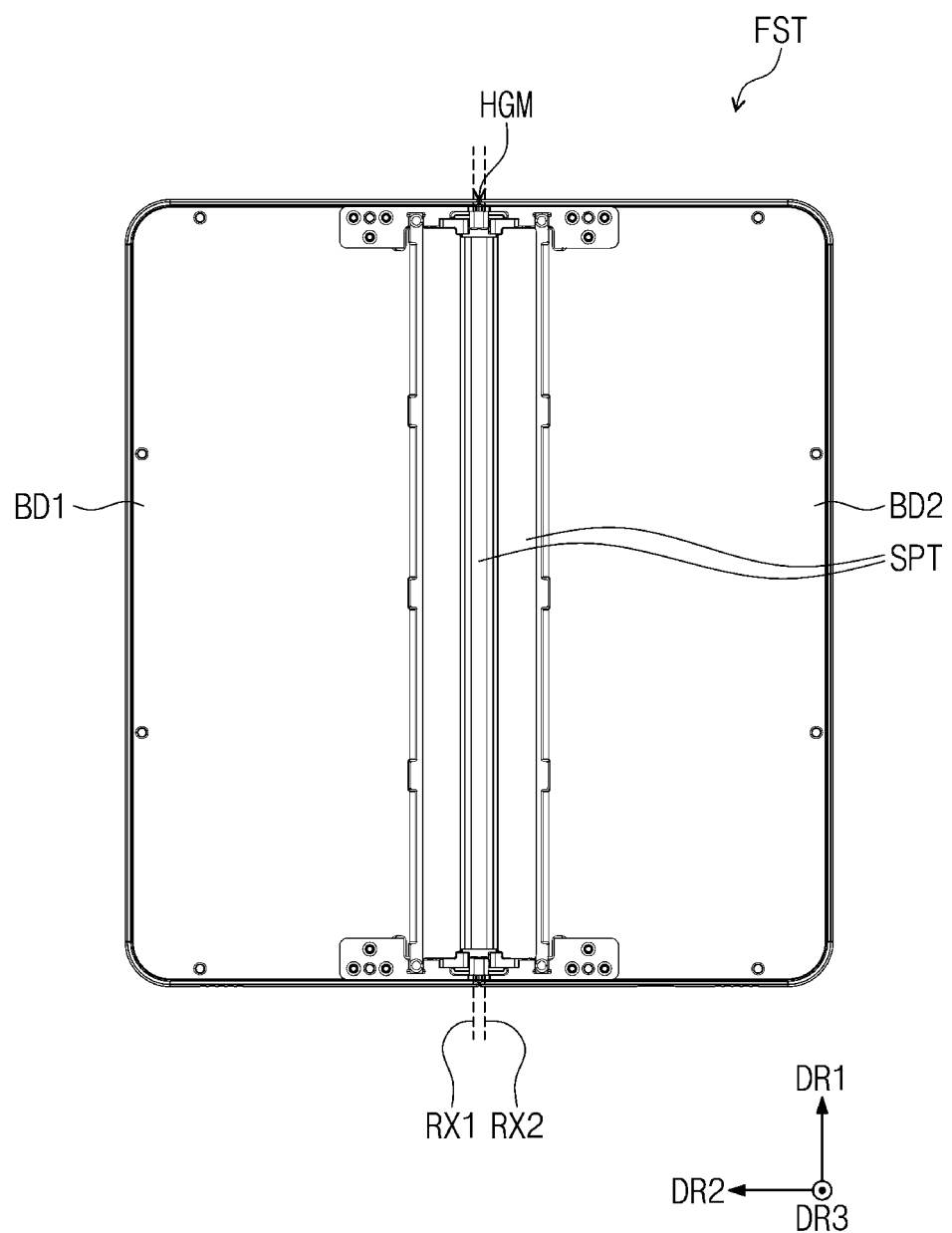
FIG. 10 is a plan view of a folding set shown in FIG. 9.

FIG. 8 is a plan view of the display device shown in FIG. 1. FIG. 9 is an exploded perspective view of the display device shown in FIG. 8. FIG. 10 is a plan view of the folding set shown in FIG. 9.

Referring to FIGS. 8 and 9, the display device DD may include the display module DM, a bezel cover BZC at least partially surrounding the display module DM, and the folding set FST disposed under the display module DM and the bezel cover BZC.

The bezel cover BZC may at least partially surround the first and second non-folding areas NFA1 and NFA2 of the display module DM. The bezel cover BZC may have a black color, however, the color of the bezel cover BZC should not necessarily be limited thereto or thereby. The non-display area NDA of the display device DD shown in FIG. 1 may include the bezel cover BZC.

The folding set FST may support the display module DM and the bezel cover BZC. The folding set FST may be folded with respect to two folding axes that are substantially parallel to the first direction DR1 and overlapping the folding area FA, in a plan view, and may fold the display module DM. This will be described in detail below.

The display module DM and the bezel cover BZC may be attached to the folding set FST by an adhesive.

Referring to FIGS. 9 and 10, the folding set FST may include a first body BD1, a second body BD2, a hinge module HGM, and a plurality of support plates SPT.

The first body BD1 and the second body BD2 may be arranged in the second direction DR2. The first body BD1 and the second body BD2 may include a plane defined by the first and second directions DR1 and DR2. The first body BD1 and the second body BD2 may have shapes that are symmetrical to each other in the second direction DR2. The electronic module EM may be disposed in the first body BD1, and the power module PSM may be disposed in the second body BD2.

The first body BD1 may be disposed under the first non-folding area NFA1 and may support the first non-folding area NFA1. The second body BD2 may be disposed under the second non-folding area NFA2 and may support the second non-folding area NFA2.

The support plates SPT may extend in the first direction DR1 and may be arranged in the second direction DR2. The support plates SPT may be disposed under the folding area FA and may support the folding area FA. The support plates SPT may be disposed between the first body BD1 and the second body BD2 and may connect the first body BD1 to the second body BD2.

The hinge module HGM may be disposed under the support plates SPT and may be disposed between the first body BD1 and the second body BD2. The hinge module HGM may be connected to both sides of the first body BD1, which are opposite to each other in the first direction DR1, and both sides of the second body BD2, which are opposite to each other in the first direction DR1. This structure will be described in detail below. The hinge module HGM may provide two rotation axes RX1 and RX2 to the first and second bodies BD1 and BD2.

The two rotation axes RX1 and RX2 may extend in the first direction DR1. The two rotation axes RX1 and RX2 may include a first rotation axis RX1 and a second rotation axis RX2, which extend in the first direction DR1 and are spaced apart from each other in the second direction DR2.

Figure 11:
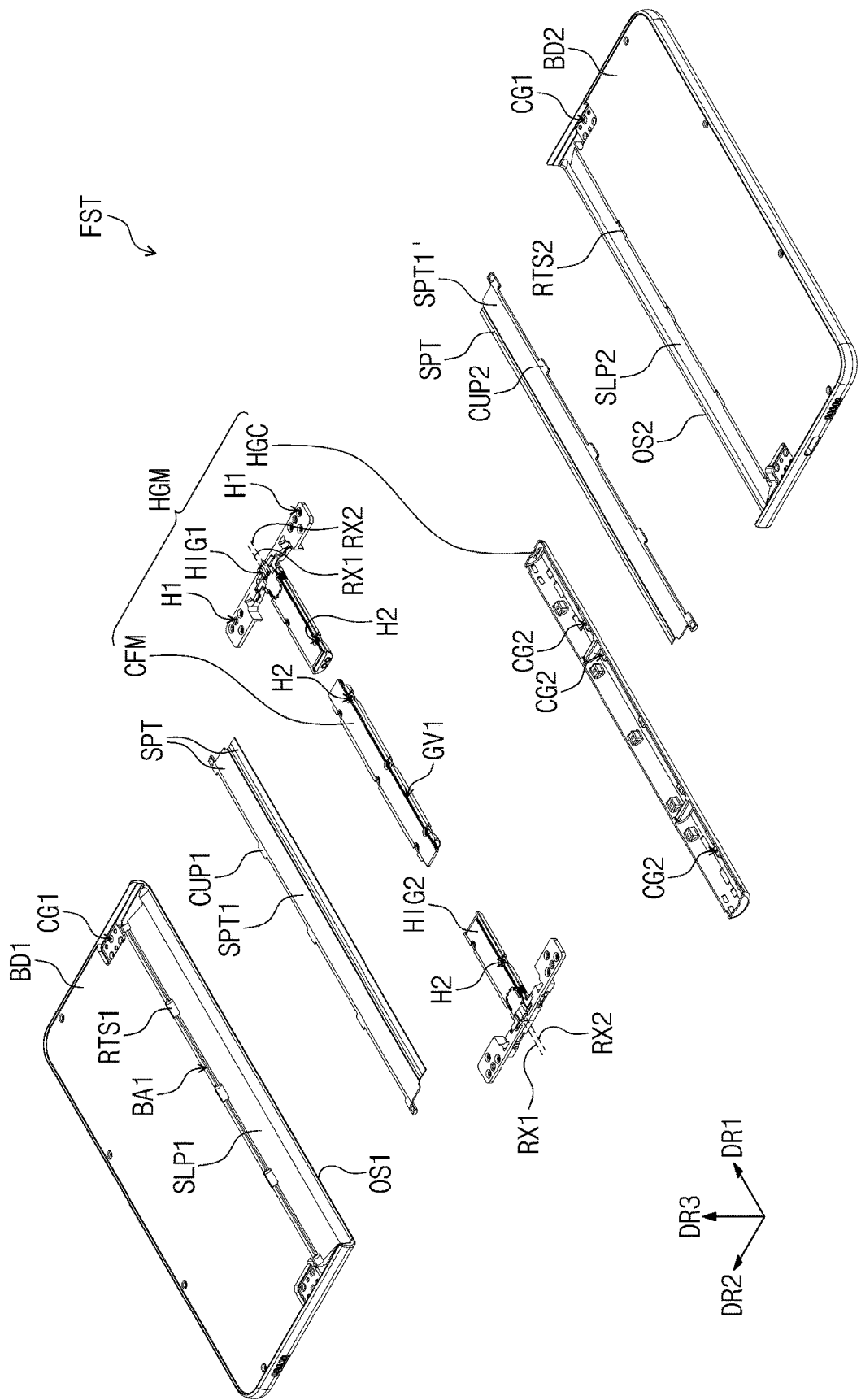
FIG. 11 is an exploded perspective view of the folding set shown in FIG. 10.

FIG. 11 is an exploded perspective view of the folding set shown in FIG. 10.

Referring to FIG. 11, an upper surface of the first body BD1, which is adjacent to one side OS1 of the first body BD1, may include a first slant surface SLP1. The first slant surface SLP1 may have a height that decreases as a distance to the one side OS1 of the first body BD1 decreases. The first slant surface SLP1 and the upper surface of the first body BD1 proximate to the first slant surface SLP1 may have a step difference.

An upper surface of the second body BD2, which is adjacent to one side OS2 of the second body BD2, may include a second slant surface SLP2. The one side OS2 of the second body BD2 may face the one side OS1 of the first body BD1. The second slant surface SLP2 may have a height that decreases as a distance to the one side OS2 of the second body BD2 decreases. The second slant surface SLP2 and the upper surface of the second body BD2 around the second slant surface SLP2 may have a step difference.

As an example, some support plates SPT are shown as being connected to the first body BD1 and the other support plates SPT are shown as being connected to the second body BD2. The support plates SPT may include a first support plate SPT1 adjacent to the first body BD1 and a first support plate SPT1' adjacent to the second body BD2. The first support plates SPT1 and SPT1' may be respectively and rotatably coupled with the first and second bodies BD1 and BD2 so as to rotate.

The first support plate SPT1 may be disposed on the first body BD1 and may be coupled with first body BD1. The first support plate SPT1 may be disposed on the first slant surface SLP1. The first support plate SPT1 may be rotatably coupled with an upper side of the first slant surface SLP1, which is most distant from the one side OS1 of the first body BD1.

The upper side of the first slant surface SLP1 may be defined as a first boundary BA1 between the first slant surface SLP1 and the upper surface of the first body BD1 proximate to the first slant surface SLP1. First rotation surfaces RTS1 may have a recessed shape in the first boundary BA1. The first rotation surfaces RTS1 may be arranged on the upper side of the first slant surface SLP1 along the first direction DR1.

The first support plate SPT1 may include a plurality of first coupling portions CUP1 protruded from the one side of the first support plate SPT1 facing the first body BD1 to the first body BD1. The first coupling portions CUP1 may be arranged in the first direction DR1. The first coupling portions CUP1 may be respectively disposed on the first rotation surfaces RTS1.

The first coupling portions CUP1 may be coupled with the first rotation surfaces RTS1 to rotate about a rotation axis extended in the first direction DR1. The first support plate SPT1 may be rotatably coupled with the first body BD1 by the first coupling portions CUP1.

The first support plate SPT1' may be disposed on the second body BD2 and may be coupled with the second body BD2. The first support plate SPT1' may be disposed on the second slant surface SLP2. The first support plate SPT1' may be rotatably coupled with an upper side of the second slant surface SLP2, which is most distant from the one side OS2 of the second body BD2.

The upper side of the second slant surface SLP2 may be defined as a second boundary BA2 between the second slant surface SLP2 and the upper surface of the second body BD2 proximate to the second slant surface SLP2. Second rotation surfaces RTS2 may have a recessed shape in the second boundary BA2. The second rotation surfaces RTS2 may be arranged on the upper side of the second slant surface SLP2 along the first direction DR1.

The first support plate SPT1' may include a plurality of second coupling portions CUP2 protruded from the one side of the first support plate SPT1' facing the second body BD2. The second coupling portions CUP2 may be arranged in the first direction DR1. The second coupling portions CUP2 may be respectively disposed in the second rotation surfaces RTS2.

The second coupling portions CUP2 may be coupled with the second rotation surfaces RTS2 to rotate about a rotation axis extended in the first direction DR1. The first support plate SPT1' may be rotatably coupled with the second body BD2 by the second coupling portions CUP2.

The hinge module HGM may include a first hinge HIG1, a second hinge HIG2, a center frame CFM, and a hinge cover HGC. The first hinge HIG1 and the second hinge HIG2 may be arranged in the first direction DR1. The first hinge HIG1 and the second hinge HIG2 may have a shape that is symmetrical to each other with respect to the first direction DR1. The first hinge HIG1 and the second hinge HIG2 may be connected to the first and second bodies BD1 and BD2 and may provide the first and second rotation axes RX1 and RX2 for the first and second bodies BD1 and BD2.

The first hinge HIG1 may be disposed between the first body BD1 and the second body BD2. The first hinge HIG1 may be connected to one sides of the first and second bodies BD1 and BD2 between both sides of the first and second bodies BD1 and BD2, which are opposite to each other in the first direction DR1.

The second hinge HIG2 may be disposed between the first body BD1 and the second body BD2. The second hinge HIG2 may be connected to the other sides of the first and second bodies BD1 and BD2 between both sides of the first and second bodies BD1 and BD2, which are opposite to each other in the first direction DR1.

The first hinge HIG1 and the second hinge HIG2 may be provided with a plurality of first holes H1 defined therethrough. The first body BD1 and the second body BD2 may be provided with a plurality of first engaging grooves CG1 defined therein. A plurality of screws may pass through the first holes H1 and may be inserted into the first engaging grooves CG1, and thus, the first and second hinges HIG1 and HIG2 may be connected to the first and second bodies BD1 and BD2.

The center frame CFM may extend in the first direction DR1 and may be disposed between the first hinge HIG1 and the second hinge HIG2. The center frame CFM may be disposed between the first body BD1 and the second body BD2. The center frame CFM may be disposed between the first support plate SPT1 and the first support plate SPT1'.

The hinge cover HGC may be disposed under the first hinge HIG1, the second hinge HIG2, and the center frame CFM. The first hinge HIG1, the second hinge HIG2, and the center frame CFM may be connected to the hinge cover HGC.

As an example, a plurality of second holes H2 may be defined through the first hinge HIG1, the second hinge HIG2, and the center frame CFM. A plurality of second engaging grooves CG2 may be defined through the hinge cover HGC. A plurality of screws may be inserted into the second engaging grooves CG2 after passing through the second holes H2, and thus, the first hinge HIG1, the second hinge HIG2, and the center frame CFM may be connected to the hinge cover HGC.

First grooves GV1 may be defined in upper portions of both sides of the center frame CFM, which are opposite to each other in the second direction DR2. The first grooves GV1 may extend in the first direction DR1. When the hinge module HGM is connected to the first and second bodies BD1 and BD2, the one side of the first support plate SPT1 and the one side of the first support plate SPT1', which face each other, may be respectively disposed in the first grooves GV1.

Figure 12A:
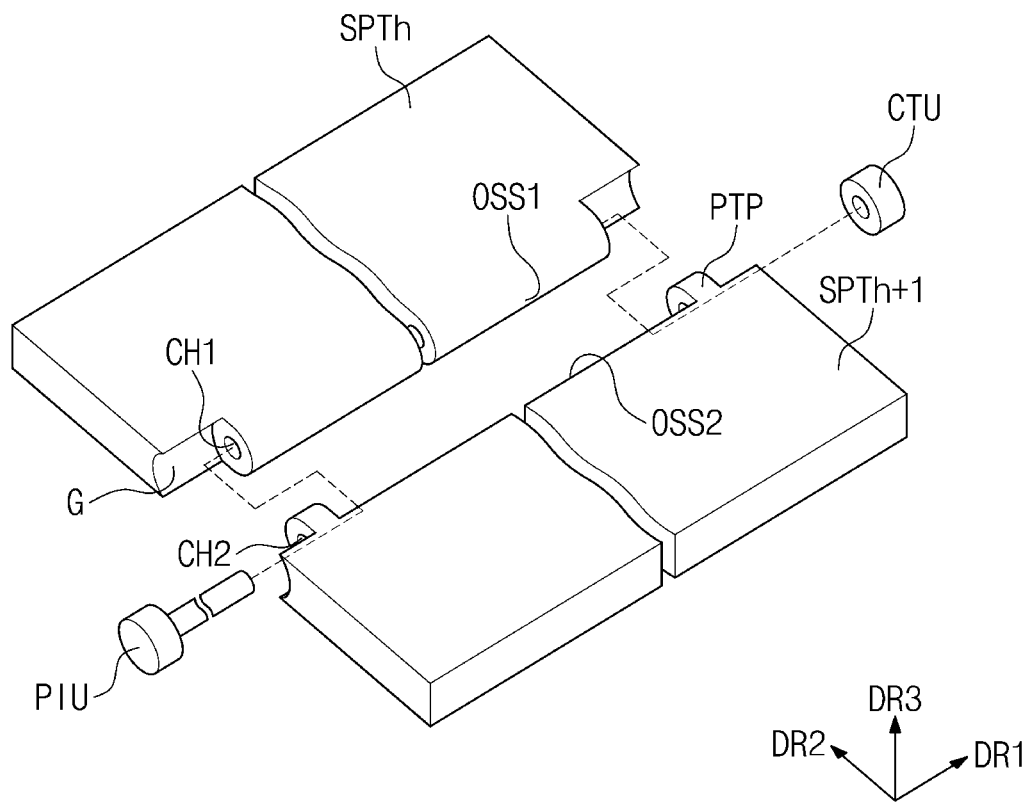
FIGS. 12A and 12B are perspective views of a connection structure between support plates adjacent to each other among support plates shown in FIG. 11.
Figure 12B:
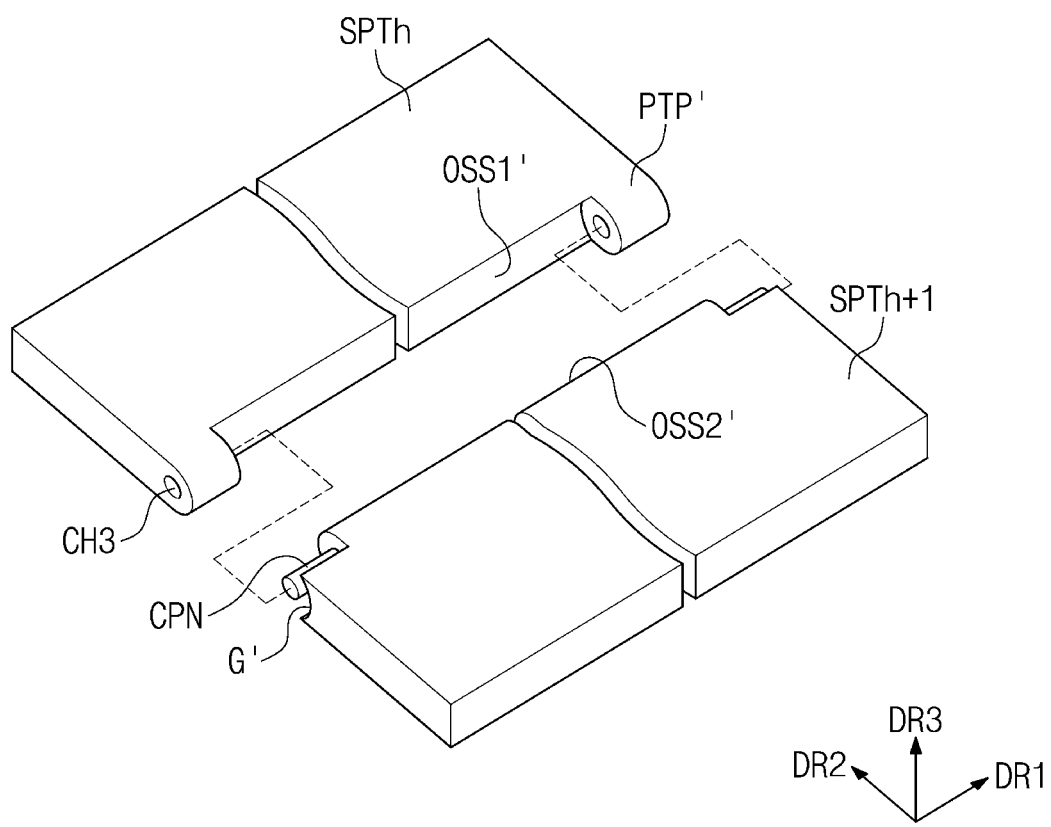

FIGS. 12A and 12B are perspective views of a connection structure between the support plates adjacent to each other among the support plates shown in FIG. 11.

Referring to FIG. 12A, an h-th support plate SPTh and an (h+1)th support plate SPTh+1 may be disposed adjacent to each other in the second direction DR2 and may be rotatably coupled with each other.

Grooves G may be defined in one side OSS1 of the h-th support plate SPTh facing the (h+1)th support plate SPTh+1. The grooves G may be defined in both sides of the h-th support plate SPTh, which are opposite to each other in the first direction DR1.

A first connection hole CH1 may be defined in a portion of the one side OSS1 disposed between the grooves G and may extend in the first direction DR1. The first connection hole CH1 may have a cylindrical shape extending in the first direction DR1.

The (h+1)th support plate SPTh+1 may include protruding portions PTP protruded from one side OSS2 of the (h+1)th support plate SPTh+1 facing the h-th support plate SPTh. The protruding portions PTP may be spaced apart from each other in the first direction DR1. Second connection holes CH2 may be defined in the protruding portions PTP and may extend in the first direction DR1. The second connection holes CH2 may have a cylindrical shape extending in the first direction DR1.

The protruding portions PTP may be disposed in the grooves G. A pin unit PIU may be inserted into the first and second connection holes CH1 and CH2, and an engaging unit CTU may be connected to an end of the pin unit PIU. According to this structure, the h-th support plate SPTh and the (h+1)th support plate SPTh+1 may be rotatably coupled with each other.

A connection relationship between the two support plates SPTh and SPTh+1 is shown as an example. The support plates SPT may be rotatably coupled with each other as shown in FIG. 12A.

Referring to FIG. 12B, an h-th support plate SPTh and an (h+1)th support plate SPTh+1 may be rotatably coupled with each other without employing the pin unit PIU and the engaging unit CTU shown in FIG. 12A.

The h-th support plate SPTh may include protruding portions PTP' protruded from one side OSS1' of the h-th support plate SPTh. The protruding portions PTP' may be respectively disposed in both sides of the h-th support plate SPTh, which are opposite to each other in the first direction DR1. Third connection holes CH3 may be defined in the protruding portions PTP' and may extend in the first direction DR1. The third connection holes CH3 may have a cylindrical shape extending in the first direction DR1.

Grooves G' may be defined in one side OSS2' of the (h+1)th support plate SPTh+1. The grooves G' may be defined in both sides of the (h+1)th support plate SPTh+1, which are opposite to each other in the first direction DR1.

Coupling pins CPN may protrude from both ends of the one side OSS2' disposed between the grooves G'. The coupling pins CPN may have a cylindrical shape extending in the first direction DR1. As the coupling pins CPN are inserted into the third connection holes CH3, the h-th support plate SPTh and the (h+1)th support plate SPTh+1 may be rotatably coupled with each other.

Hereinafter, the structure of the support plates SPT shown in FIG. 12A will be described as a representative example.

Figure 13:
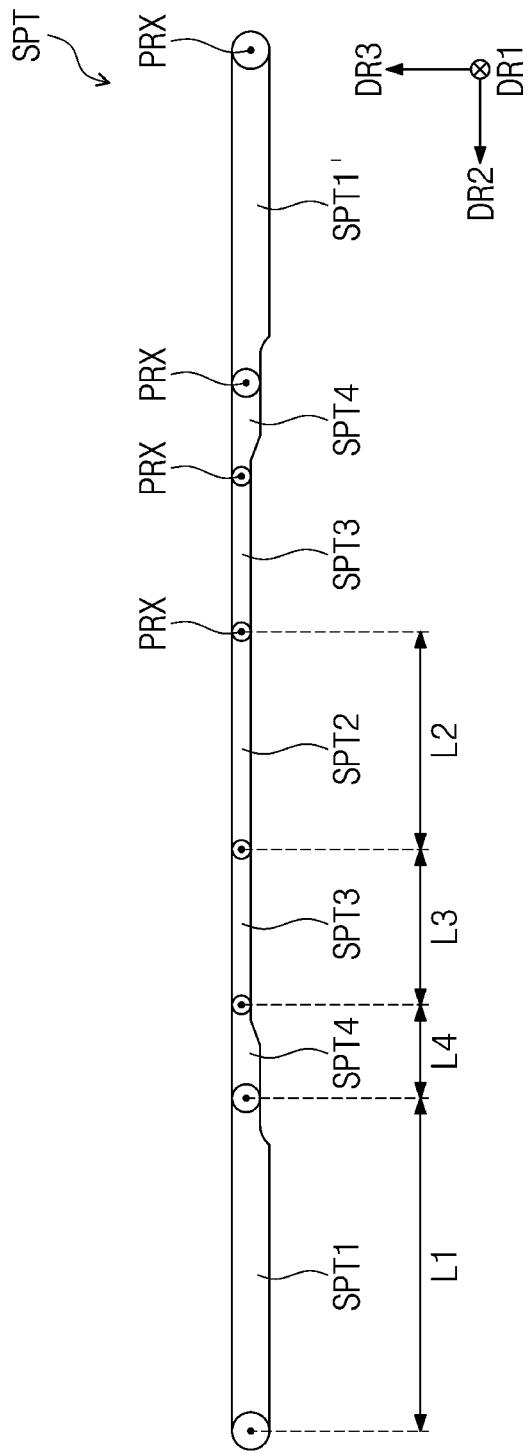
FIG. 13 is a side view of support plates, when viewed in a first direction among support plates shown in FIG. 11.

FIG. 13 is a side view of the support plates SPT shown in FIG. 11 when viewed in the first direction.

As an example, the support plates SPT shown in FIG. 13 are coupled to each other by the pin units PIU shown in FIG. 12A.

Referring to FIG. 13, the support plates SPT may be arranged in the second direction DR2 and may be rotatably coupled with each other by the pin units PIU. Rotation axes PRX may be defined in both sides of each of the support plates SPT, which are opposite to each other in the second direction DR2. The rotation axes PRX may be defined at center points of the pin units PIU. The support plates SPT may rotate with respect to rotation axes PRX.

The support plates SPT may include the first support plates SPT1 and SPT1' respectively disposed at leftmost and rightmost sides, a second support plate SPT2 disposed at a center, third support plates SPT3 disposed between the second support plate SPT2 and the first support plates SPT1 and SPT1', and fourth support plates SPT4 disposed between the third support plates SPT3 and the first support plates SPT1 and SPT1'.

The first support plate SPT1, the third support plate SPT3, and the fourth support plate SPT4, which are disposed at the left side of the second support plate SPT2, and the second support plate SPT2 may have different lengths from each other in the second direction DR2. In addition, the first support plate SPT1', the third support plate SPT3, and the fourth support plate SPT4, which are disposed at the right side of the second support plate SPT2, and the second support plate SPT2 may have different lengths from each other in the second direction DR2. This will be described in detail below.

As an example, the first, third, and fourth support plates SPT1, SPT3, and SPT4 disposed at the left side of the second support plate SPT2 and the first, third, and fourth support plates SPT1', SPT3, and SPT4 disposed at the right side of the second support plate SPT2 may be symmetrical with respect to each other. Accordingly, the lengths of the first, third, and fourth support plates SPT1, SPT3, and SPT4 disposed at the left side of the second support plate SPT2 may be substantially the same as the lengths of the first, third, and fourth support plates SPT1', SPT3, and SPT4 disposed at the right side of the second support plate SPT2, respectively.

However, the present disclosure should not necessarily be limited thereto or thereby. According to an embodiment, the first, third, and fourth support plates SPT1, SPT3, and SPT4 disposed at the left side of the second support plate SPT2 might not be symmetrical with the first, third, and fourth support plates SPT1', SPT3, and SPT4 disposed at the right side of the second support plate SPT2. Accordingly, the lengths of the first, third, and fourth support plates SPT1, SPT3, and SPT4 disposed at the left side of the second support plate SPT2 may be different from the lengths of the first, third, and fourth support plates SPT1', SPT3, and SPT4 disposed at the right side of the second support plate SPT2, respectively.

Hereinafter, the first, third, and fourth support plates SPT1, SPT3, and SPT4 disposed at the left side of the second support plate SPT2 and the first, third, and fourth support plates SPT1', SPT3, and SPT4 disposed at the right side of the second support plate SPT2 will be described as having the symmetrical shape with respect to the second support plate SPT2.

Each of the first support plates SPT1 and SPT1' may have a first length L1 in the second direction DR2. The second support plate SPT2 may have a second length L2 smaller than the first length L1 in the second direction DR2. Each of the third support plates SPT3 may have a third length L3 smaller than the second length L2 in the second direction DR2. Each of the fourth support plates SPT4 may have a fourth length L4 smaller than the third length L3 in the second direction DR2.

Figure 14:
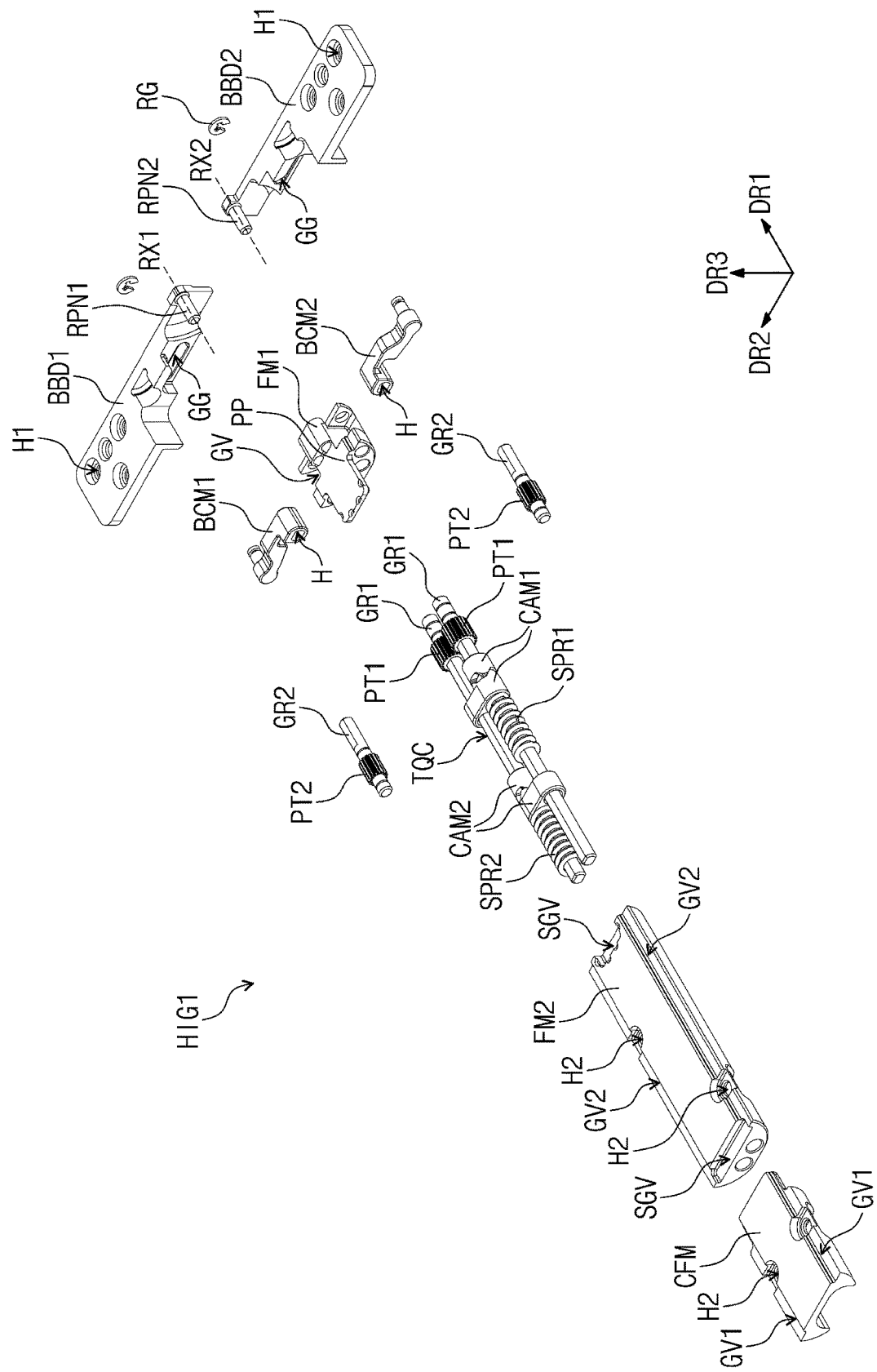
FIG. 14 is an exploded perspective view of a first hinge shown in FIG. 11.
Figure 15:
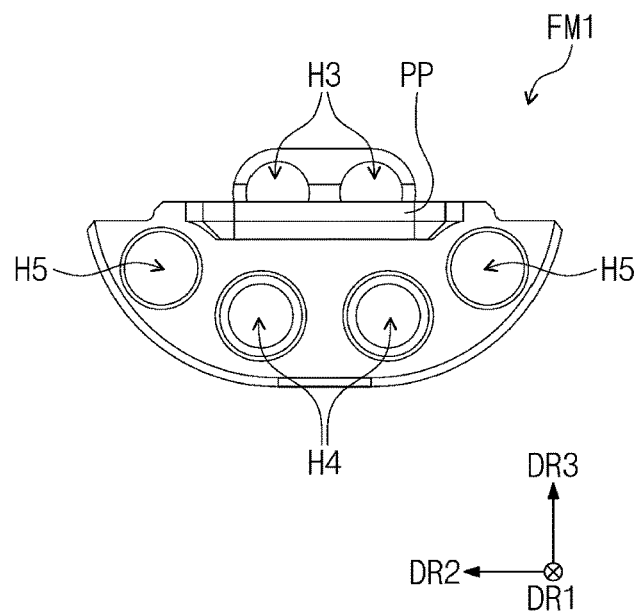
FIG. 15 is a front view of a first frame shown in FIG. 14, when viewed a first direction.
Figure 16:
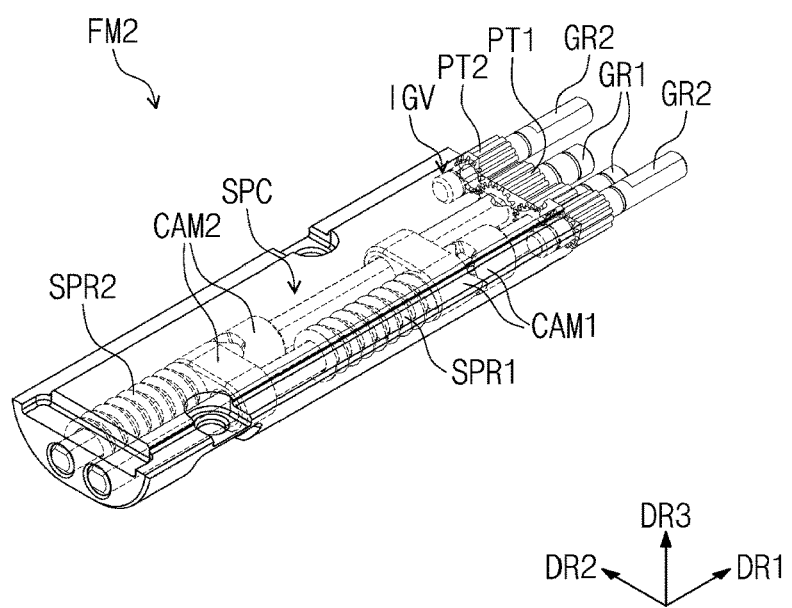
FIG. 16 is an inside perspective view of a second frame shown in FIG. 14.

FIG. 14 is an exploded perspective view of the first hinge shown HIG1 in FIG. 11. FIG. 15 is a front view of a first frame FM1 shown in FIG. 14 when viewed a first direction. FIG. 16 is an inside perspective view of a second frame FM2 shown in FIG. 14.

Since the second hinge HIG2 may have substantially the same structure as that of the first hinge HIG1, the structure of the first hinge HIG1 will be described in detail below, and to the extent that the structure of the second hinge HIG2 is not described again, it is to be assumed that these structures are at least similar to corresponding structures that are described elsewhere within the instant specification. In FIG. 14, a portion of the center frame CFM is shown.

Referring to FIGS. 11 and 14, the first hinge HIG1 may include a plurality of bracket bodies BBD1 and BBD2, a plurality of rotation pin units RPN1 and RPN2, a plurality of bracket cams BCM1 and BCM2, the first frame FM1, a plurality of gears GR1 and GR2, a plurality of cams CAM1 and CAM2, a plurality of springs SPR1 and SPR2, the second frame FM2, and a plurality of ring units RG. Some gears GR1 among the gears GR1 and GR2, the cams CAM1 and CAM2, and the springs SPR1 and SPR2 may be defined as a torque controller TQC.

The bracket bodies BBD1 and BBD2 may be connected to the first and second bodies BD1 and BD2 and the rotation pin units RPN1 and RPN2. The rotation pin units RPN1 and RPN2 may be connected to the first and second bodies BD1 and BD2 through the bracket bodies BBD1 and BBD2.

The bracket bodies BBD1 and BBD2 may include a first bracket body BBD1 connected to the first body BD1 and a second bracket body BBD2 connected to the second body BD2. The first bracket body BBD1 and the second bracket body BBD2 may be arranged in the second direction DR2 and may have shapes that are symmetrical to each other with respect to the second direction DR2. The first holes H1 may be defined through the first and second bracket bodies BBD1 and BBD2.

The rotation pin units RPN1 and RPN2 may include a first rotation pin unit RPN1 connected to the first bracket body BBD1 and a second rotation pin unit RPN2 connected to the second bracket body BBD2. The first rotation pin unit RPN1 and the second rotation pin unit RPN2 may be spaced apart from each other in the second direction DR2 and may extend in the first direction DR1. The first rotation pin unit RPN1 and the second rotation pin unit RPN2 may respectively define the first rotation axis RX1 and the second rotation axis RX2.

The first rotation pin unit RPN1 and the second rotation pin unit RPN2 may be respectively connected to one side of the first bracket body BBD1 and one surface of the second bracket body BBD2, which face each other in the second direction DR2. The first and second rotation pin units RPN1 and RPN2 may be connected to the first and second bracket bodies BBD1 and BBD2 after being separately manufactured, however, they should not necessarily be limited thereto or thereby. According to an embodiment, the first and second rotation pin units RPN1 and RPN2 may be provided integrally with the first and second bracket bodies BBD1 and BBD2 and may extend from the first and second bracket bodies BBD1 and BBD2.

The first frame FM1, the second frame FM2, and the center frame CFM may be arranged in the first direction DR1. The second frame FM2 may be disposed between the first frame FM1 and the center frame CFM. The first frame FM1 may be disposed between the first and second bracket bodies BBD1 and BBD2 and the second frame FM2. The center frame CFM and the second frame FM2 may be defined as central bodies. The central bodies CFM and FM2 may be disposed under the folding area FA shown in FIG. 9.

Referring to FIGS. 14 and 15, the first and second rotation pin units RPN1 and RPN2 may be inserted into the first frame FM1 and may be coupled with the first frame FM1. As an example, third holes H3 may be defined in a portion of the first frame FM1 adjacent to an upper side of the first frame FM1 and may extend in the first direction DR1. The first and second rotation pin units RPN1 and RPN2 may be respectively inserted into the third holes H3 and may be coupled with the first frame FM1.

The gears GR1 and GR2 may extend in the first direction DR1. The gears GR1 and GR2 may include a plurality of first gears GR1 and a plurality of second gears GR2. As an example, two first gears GR1 and two second gears GR2 are shown, however, the number of the first and second gears GR1 and GR2 should not necessarily be limited thereto or thereby. The first gears GR1 may extend in the first direction DR1 and may be meshed with each other to rotate in the second direction DR2.

The second gears GR2 may extend in the first direction DR1 and may be spaced apart from each other in the second direction DR2. The first gears GR1 may be disposed between the second gears GR2. The second gears GR2 may be meshed with the first gears GR1 in the second direction DR2 and may rotate. The first and second gears GR1 and GR2 may rotate with respect to gear rotation axes parallel to the first direction DR1.

The first gears GR1 may include a plurality of first protruding portions PT1 disposed on an outer circumferential surface of the first gears GR1 adjacent to one sides of the first gears GR1 between both sides of the first gears GR1, which are opposite to each other in the first direction DR1, to define a shape of the gear. As the first protruding portions PT1 of the first gears GR1 are meshed with each other to move, the first gears GR1 may rotate.

One sides of the second gears GR2 between both sides of the second gears GR2, which are opposite to each other in the first direction DR1, may be disposed adjacent to the one sides of the first gears GR1. The second gears GR2 may include a plurality of second protruding portions PT2 disposed on an outer circumferential surface of the second gears GR2, which is adjacent to the other sides of the second gears GR2 between both sides of the second gears GR2 to define a shape of the gear. As the second protruding portions PT2 are engaged with the first protruding portions PT1 to move, the second gears GR2 may rotate with the first gears GR1.

The first gears GR1 may be inserted into the cams CAM1 and CAM2 and the springs SPR1 and SPR2, and thus, the cams CAM1 and CAM2 and the springs SPR1 and SPR2 may be disposed on the first gears GR1. The other sides of the first gears GR1 may be inserted into the cams CAM1 and CAM2 and the springs SPR1 and SPR2. The cams CAM1 and CAM2 and the springs SPR1 and SPR2 may be disposed between the first protruding portions PT1 and the other sides of the first gears GR1.

The one sides of the first and second gears GR1 and GR2 may face the first frame FM1, and the other sides of the first and second gears GR1 and GR2 may face the second frame FM2. The one sides of the first and second gears GR1 and GR2 may be inserted into the first frame FM1, and the other sides of the first and second gears GR1 and GR2 may be inserted into the second frame FM2.

A plurality of fourth and fifth holes H4 and H5 may be defined in a portion of the first frame FM1 adjacent to a lower portion of the first frame FM1 and may extend in the first direction DR1. The fourth and fifth holes H4 and H5 may be disposed lower than the third holes H3. The fourth holes H4 may correspond to the first gears GR1. The fifth holes H5 may correspond to the second gears GR2.

The one sides of the first gears GR1 may be respectively inserted into the fourth holes H4, and the first gears GR1 may be coupled with the first frame FM1 of the first gears GR1. The one sides of the second gears GR2 may be respectively inserted into the fifth holes H5, and the second gears GR2 may be coupled with the first frame FM1.

A portion of the first frame FM1 disposed between the third holes H3 and the fourth holes H4 may be defined as a flat portion PP and may have a flat plate shape defined by the first and second directions DR1 and DR2.

Seating grooves SGV may be defined in upper portions of both sides of the second frame FM2, which face each other in the first direction DR1. An end of the flat portion PP may be disposed in the seating groove SGV of the second frame FM2 facing the first frame FM1. An upper portion of one side of the center frame CFM may be disposed in the seating groove SGV of the second frame FM2 facing the center frame CFM.

Referring to FIGS. 14 and 16, an inner space SPC and a plurality of insertion grooves IGV may be defined in the second frame FM2. The inner space SPC may be defined corresponding to the first gears GR1. The insertion grooves IGV may be defined corresponding to the second gears GR2. The other sides of the first gears GR1 may be inserted into the inner space SPC. The other sides of the second gears GR2 may be respectively inserted into the insertion grooves IGV.

Two holes may be defined in an end of the inner space SPC, the other sides of the first gears GR1 may be respectively disposed in the two holes. First and second cams CAM1 and CAM2 and first and second springs SPR1 and SPR2 may be disposed in the inner space SPC to be disposed in the second frame FM2.

Referring to FIG. 14, the bracket cams BCM1 and BCM2 may include a first bracket cam BCM1 coupled with the first bracket body BBD1 and a second bracket cam BCM2 coupled with the second bracket body BBD2. The first bracket cam BCM1 and the second bracket cam BCM2 may be arranged in the second direction DR2 and may have shapes that are symmetrical to each other with respect to the second direction DR2.

Grooves GV may be defined in both sides of the first frame FM1, which are opposite to each other in the second direction DR2. The first and second bracket cams BCM1 and BCM2 may be disposed in the grooves GV. One sides of the first and second bracket cams BCM1 and BCM2 facing each other in second direction DR2 may be disposed in the grooves GV.

The one sides of the second gears GR2 may be inserted into the one sides of the first and second bracket cams BCM1 and BCM2. Accordingly, the one sides of the first and second bracket cams BCM1 and BCM2 may be coupled with the second gears GR2. The one sides of the second gears GR2 may be inserted into holes H defined through the one sides of the first and second bracket cams BCM1 and BCM2, and the first and second bracket cams BCM1 and BCM2 may be coupled with the second gears GR2.

The other sides of the first and second bracket cams BCM1 and BCM2 may protrude in the first direction DR1 and may be respectively disposed in guide grooves GG defined in the first and second bracket bodies BBD1 and BBD2. The ring units RG may be disposed on the other sides of the first and second bracket cams BCM1 and BCM2 protruded in the first direction DR1.

The guide grooves GG may be defined in one surfaces of the first and second bracket bodies BBD1 and BBD2 facing the first and second bracket cams BCM1 and BCM2. The guide grooves GG may extend in the second direction DR2.

When the first and second rotation pin units RPN1 and RPN2 rotate, the first and second bracket cams BCM1 and BCM2 may rotate with the second gears GR2 and may move along the guide grooves GG. This operation will be described in detail below.

Second grooves GV2 may be defined in upper portions of both sides of the second frame FM2, which are opposite to each other in the second direction DR2. The second grooves GV2 may extend in the first direction DR1. When the hinge module HGM is connected to the first and second bodies BD1 and BD2, the one side of the first support plate SPT1 and the one side of the first support plate SPT1', which face each other, may be disposed in the second grooves GV2.

Figure 17:
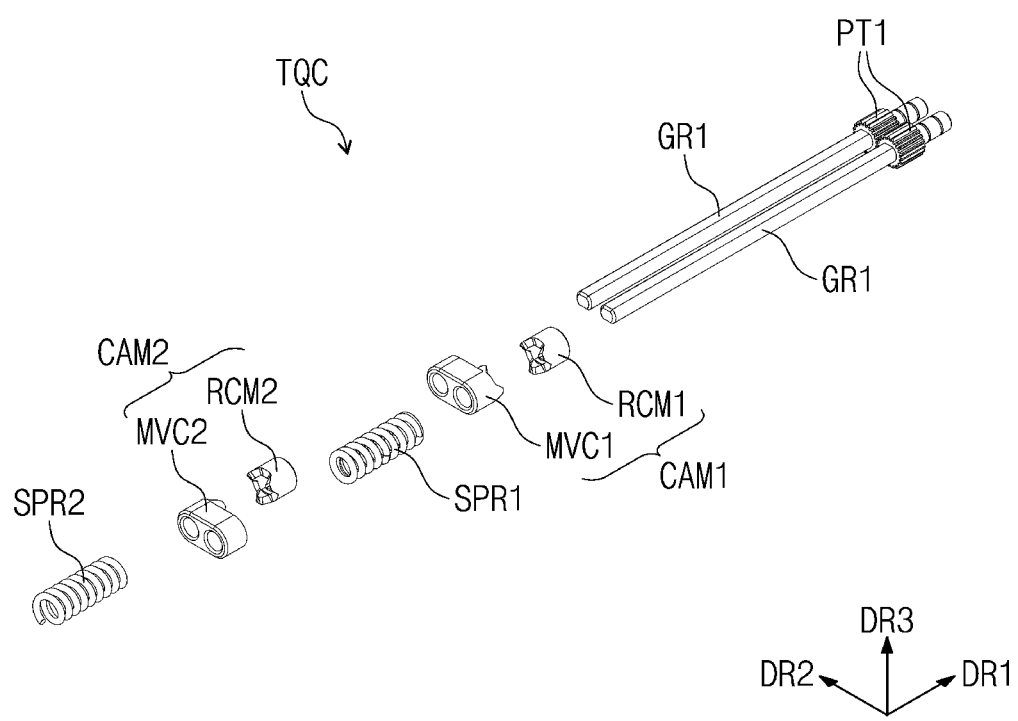
FIG. 17 is an exploded perspective view of a torque controller shown in FIG. 14.

FIG. 17 is an exploded perspective view of the torque controller TQC shown in FIG. 14.

Hereinafter, description will be made with reference to FIG. 14 when it is necessary.

Referring to FIGS. 14 and 17, the torque controller TQC may include the first gears GR1, the cams CAM1 and CAM2, and the springs SPR1 and SPR2. The cams CAM1 and CAM2 may include the first cam CAM1 and the second cam CAM2 spaced apart from the first cam CAM1 in the first direction DR1.

The first cam CAM1 may include a first moving cam MVC1 and a first rotation cam RCM1. The second cam CAM2 may include a second moving cam MVC2 and a second rotation cam RCM2. The springs SPR1 and SPR2 may include the first spring SPR1 and the second spring SPR2, which extend in the first direction DR1.

The first gears GR1 may be inserted into the first and second moving cams MVC1 and MVC2. The first gears GR1 may be commonly inserted into the first and second moving cams MVC1 and MVC2. The first gears GR1 may be inserted into holes defined through the first and second moving cams MVC1 and MVC2 in the first direction DR1. One sides of the first gears GR1 may pass through the holes defined through the first and second moving cams MVC1 and MVC2, and thus, the first and second moving cams MVC1 and MVC2 may be disposed on outer circumferential surfaces of portions of the first gears GR1.

The first gears GR1 may be inserted into the first and second rotation cams RCM1 and RCM2. The first gears GR1 may be respectively inserted into the first and second rotation cams RCM1 and RCM2 such that the first gears GR1 may correspond to the first and second rotation cams RCM1 and RCM2 in a one-to-one correspondence.

A corresponding first gear GR1 of the first gears GR1 may be inserted into a hole defined through each of the first and second rotation cams RCM1 and RCM2 in the first direction DR1. The one sides of the first gears GR1 may pass through the holes defined through the first and second rotation cams RCM1 and RCM2, and thus, the first and second rotation cams RCM1 and RCM2 may be disposed on the outer circumferential surfaces of the portions of the first gears GR1.

The first gears GR1 may be inserted into the first and second springs SPR1 and SPR2. The first gears GR1 may be respectively inserted into the first and second springs SPR1 and SPR2 such that the first and second springs SPR1 and SPR2 may correspond to the first gears GR1 in a one-to-one correspondence.

Each of the first and second moving cams MVC1 and MVC2 may be disposed between a corresponding rotation cam between the first and second rotation cams RCM1 and RCM2 and a corresponding spring between the first and second springs SPR1 and SPR2. The rotation cam and the spring, which correspond to each other, may be disposed at the same first gear GR1. Accordingly, each of the first and second moving cams MVC1 and MVC2 may be disposed between the rotation cam and the spring disposed at a corresponding first gear GR1 of the first gears GR1.

The first moving cam MVC1 may be disposed between the first rotation cam RCM1 and the first spring SPR1, which are disposed at one first gear GR1. The second moving cam MVC2 may be disposed between the second rotation cam RCM2 and the second spring SPR2, which are disposed at the other first gear GR1.

One surface of the moving cam and one surface of the rotation cam, which are disposed at the same first gear GR1 and face each other, may include protruding portions. The protruding portions of the one surface of the moving cam and the protruding portions of the one surface of the rotation cam, which are disposed at the same first gear GR1 may be staggered with each other.

As an example, one surface of the first moving cam MVC1 and one surface of the first rotation cam RCM1, which are disposed at one first gear GR1 and face each other, may include protruding portions. The protruding portions of the one surface of the first moving cam MVC1 and the protruding portions of the one surface of the first rotation cam RCM1 may be staggered with each other.

One surface of the second moving cam MVC2 and one surface of the second rotation cam RCM2, which are disposed at the other first gear GR1 and face each other, may include protruding portions. The protruding portions of the one surface of the second moving cam MVC2 and the protruding portions of the one surface of the second rotation cam RCM2 may be staggered with each other.

Figure 18:
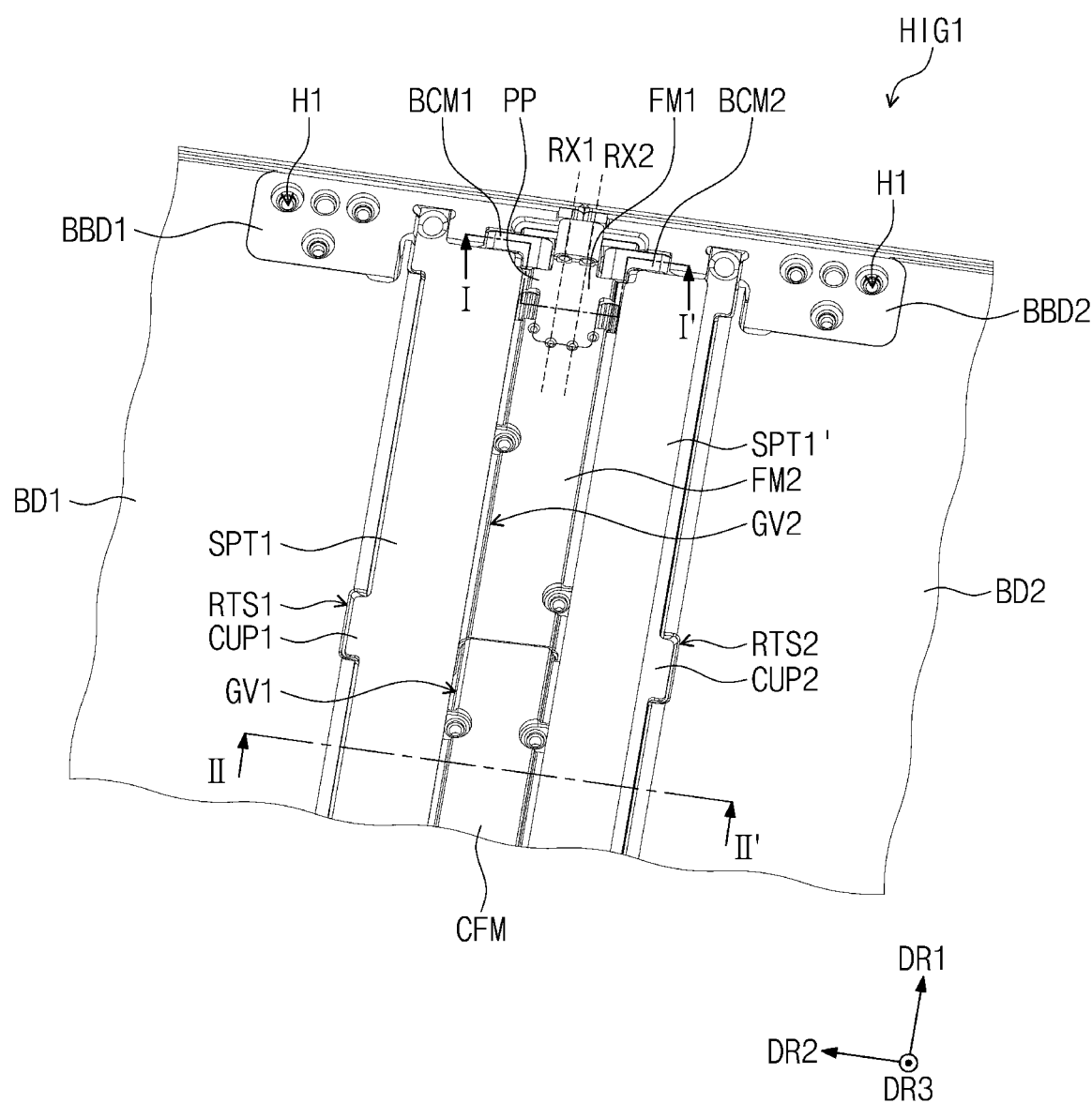
FIG. 18 is a perspective view showing a state in which the first hinge of FIGS. 11 and 14 is coupled with first and second bodies.
Figure 19:
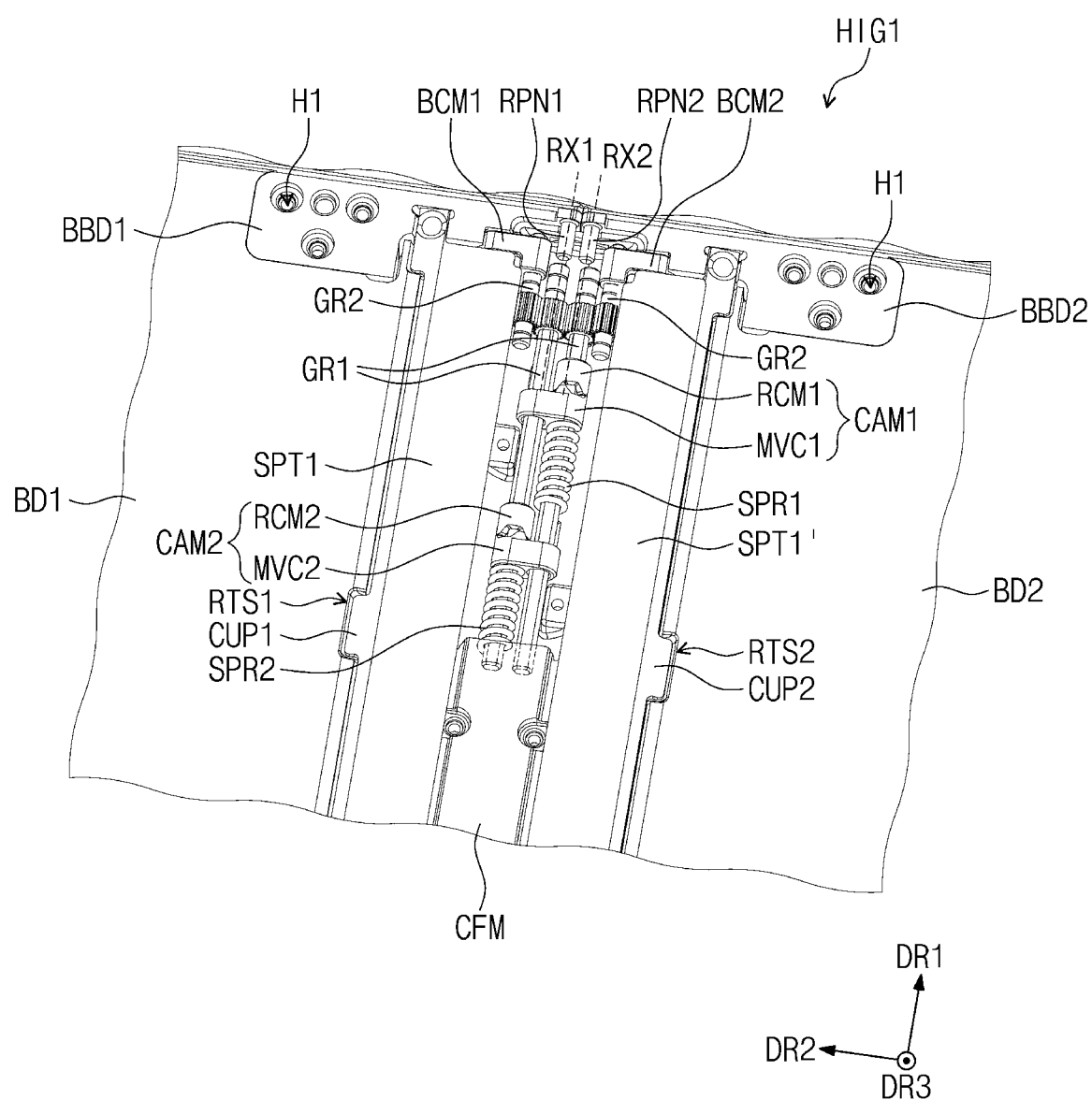
FIG. 19 is a perspective view of components disposed in first and second frames shown in FIG. 18.

FIG. 18 is a view showing a state in which the first hinge of FIGS. 11 and 14 is coupled with the first and second bodies. FIG. 19 is a view of components disposed in the first and second frames shown in FIG. 18.

As an example, the second, third, and fourth support plates SPT2, SPT3, and SPT4 are omitted in FIGS. 18 and 19, and the first and second frames FM1 and FM2 are omitted in FIG. 19. Hereinafter, descriptions will be made with reference to FIG. 14 when it is necessary.

Referring to FIGS. 14, 18, and 19, the first and second bracket bodies BBD1 and BBD2 may be connected to the first and second bodies BD1 and BD2 by screws inserted into the first holes H1.

The first and second rotation pin units RPN1 and RPN2 may be inserted into the first frame FM1 and may be rotatably coupled with the first frame FM1. The first rotation pin unit RPN1 may define the first rotation axis RX1, and the second rotation pin unit RPN2 may define the second rotation axis RX2.

The first and second bracket cams BCM1 and BCM2 may be coupled with the first and second bracket bodies BBD1 and BBD2. The first and second bracket cams BCM1 and BCM2 may be disposed at the first frame FM1, the second gears GR2 may be inserted into the first and second bracket cams BCM1 and BCM2, and thus, the first and second bracket cams BCM1 and BCM2 may be coupled with the first frame FM1. The first and second bracket cams BCM1 and BCM2 may be coupled with the second gears GR2 and may rotate with the second gears GR2.

An end of the flat portion PP may be disposed in the seating groove SGV defined in the one side of the second frame FM2, and the first and second frames FM1 and FM2 may be connected to each other by engaging units such as screws.

The first and second gears GR1 and GR2 may be inserted into the first and second frames FM1 and FM2 and may be coupled with the first and second frames FM1 and FM2. The first and second protruding portions PT1 and PT2 may be arranged to engage with each other and may be coupled to rotate with each other.

The first and second moving cams MVC1 and MVC2, the first and second rotation cams RCM1 and RCM2, and the first and second springs SPR1 and SPR2 may be coupled with the first gears GR1 and may be disposed in the second frame FM2. The first and second rotation cams RCM1 and RCM2 may be coupled with the first gears GR1 to rotate with the first gears GR1.

The one side of the first support plate SPT1 and the one side of the first support plate SPT1' may be disposed in the first grooves GV1 and the second grooves GV2. The first and second coupling portions CUP1 and CUP2 of the first support plates SPT1 and SPT1' may be rotatably coupled with the first and second rotation surfaces RTS1 and RTS2 defined in the first and second bodies BD1 and BD2.

Figure 20A:
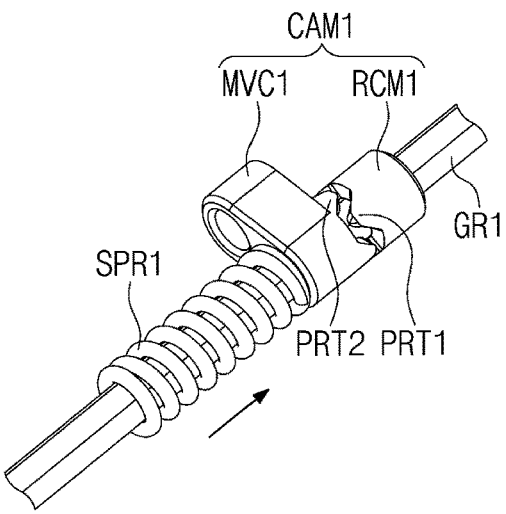
FIGS. 20A and 20B are perspective views illustrating an operation of a first rotation cam and a first moving cam shown in FIG. 19.
Figure 20B:
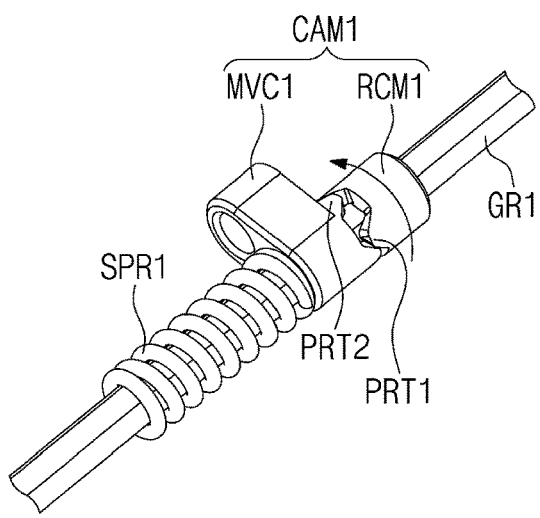

FIGS. 20A and 20B are views illustrating an operation of the first rotation cam RCM1 and the first moving cam MVC1 shown in FIG. 19.

The operation of the first rotation cam RCM1 and the first moving cam MVC1 will be described as a representative example, and an operation of the second rotation cam RCM2 (refer to FIG. 17) and the second moving cam MVC2 (refer to FIG. 17) may be substantially the same as the operation of the first rotation cam RCM1 and the first moving cam MVC1.

Referring to FIG. 20A, first protruding portions PRT1 of the first rotation cam RCM1 may be disposed between second protruding portions PRT2 of the first moving cam MVC1. The state in which the first protruding portions PRT1 are disposed between the second protruding portions PRT2 may be maintained by an elastic force generated by the first spring SPR1. As an example, FIG. 20A shows the operation of the first rotation cam RCM1 and the first moving cam MVC1 when the display device DD is in an unfolded state.

As the state in which the first protruding portions PRT1 are disposed between the second protruding portions PRT2 is maintained, the unfolded state of the display device DD may be easily maintained.

Referring to FIG. 20B, the display device DD may be folded by an external force, e.g., a force generated by a user. When the first rotation cam RCM1 is rotated by the external force, the first protruding portions PRT1 may move in a counterclockwise direction along the protruded upper surfaces of the second protruding portions PRT2. When the user's force is greater than a force required to maintain the state in which the first protruding portions PRT1 are disposed between the second protruding portions PRT2, the first protruding portions PRT1 may move along the upper surfaces of the second protruding portions PRT2, and thus, the display device DD may be folded.

Due to the operation, when the display device DD is unfolded by the user, the unfolded state of the display device DD may be easily maintained (e.g., it may persist), and when the user wants to fold the display device DD, the display device DD may be folded by applying a predetermined force to the display device DD. For this operation, the torque controller TQC including the first and second cams CAM1 and CAM2 may be provided to the hinge module HGM.

Figure 21A:
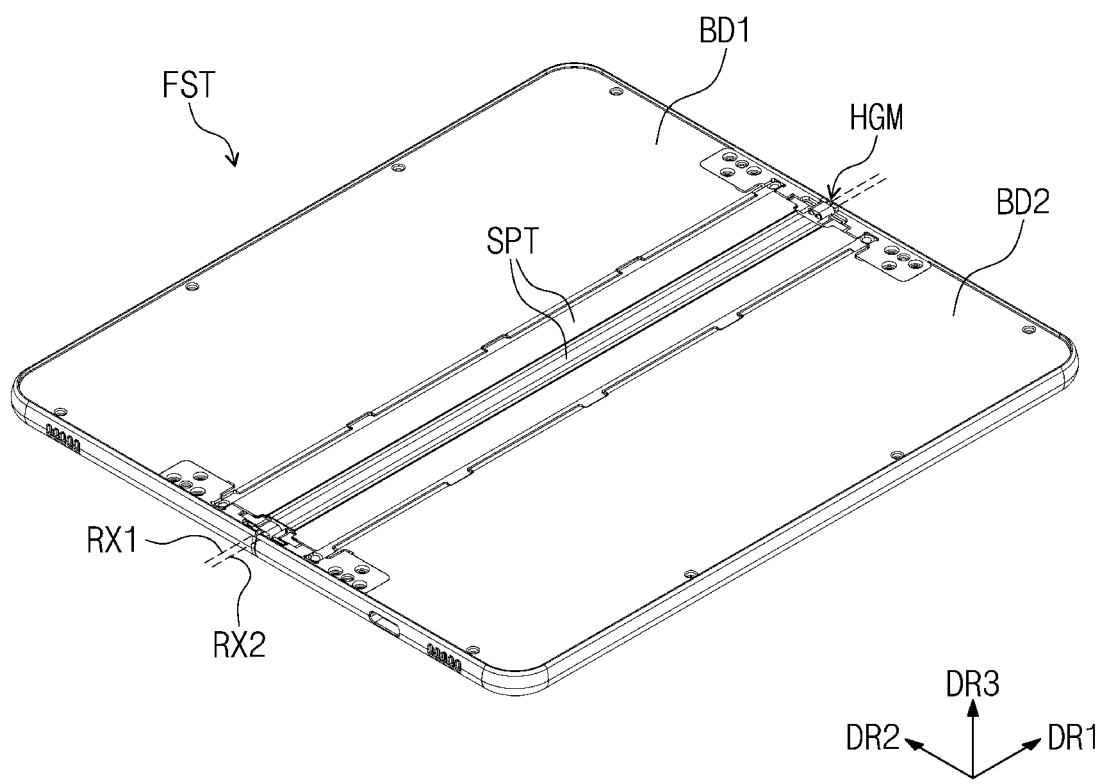
FIG. 21A is a perspective view of an unfolded state of the folding set shown in FIG. 10.
Figure 21B:
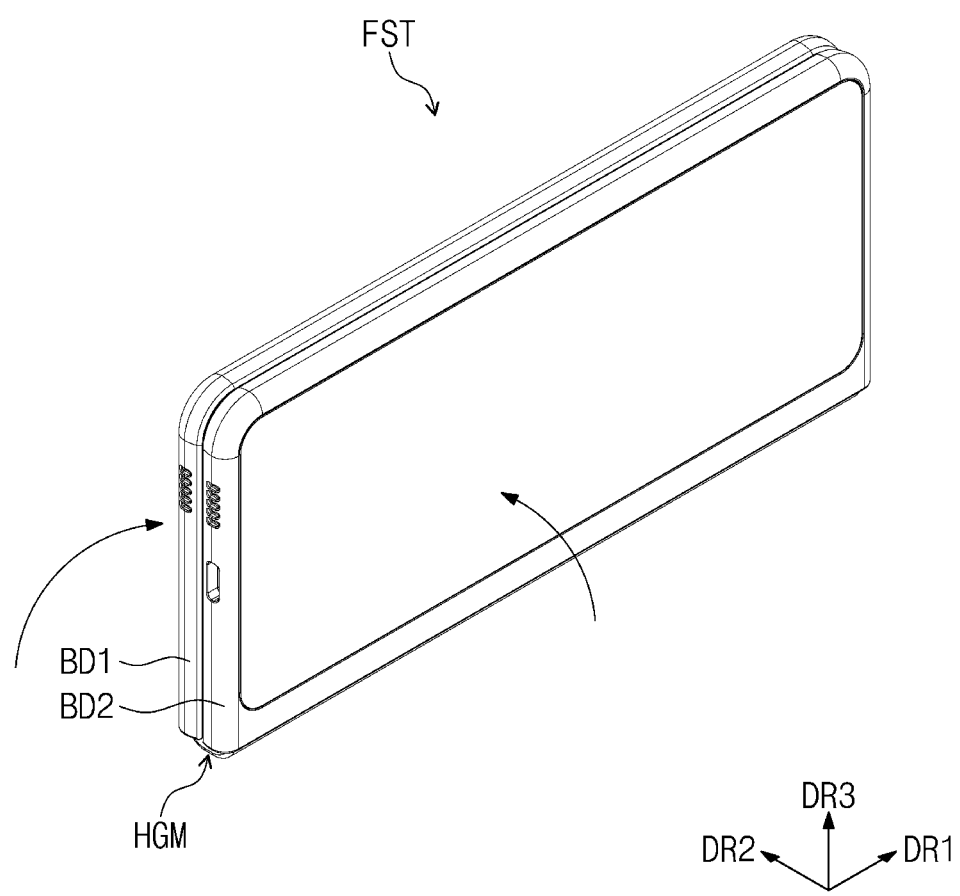
FIG. 21B is a perspective view of a folded state of the folding set shown in FIG. 21A.

FIG. 21A is a view of an unfolded state of the folding set FST shown in FIG. 10. FIG. 21B is a view of a folded state of the folding set FST shown in FIG. 21A.

Referring to FIGS. 21A and 21B, the folding set FST may rotate with respect to the first and second rotation axes RX1 and RX2 defined by the first and second rotation pin units RPN1 and RPN2 and may be folded. The support plates SPT may rotate with each other according to the folding operation of the folding set FST. The display module DM (refer to FIG. 23C) disposed on the folding set FST may be folded according to the folding operation of the folding set FST. The folded state of the display module DM will be shown in FIGS. 23A, 23B, and 23C.

Figure 22A:
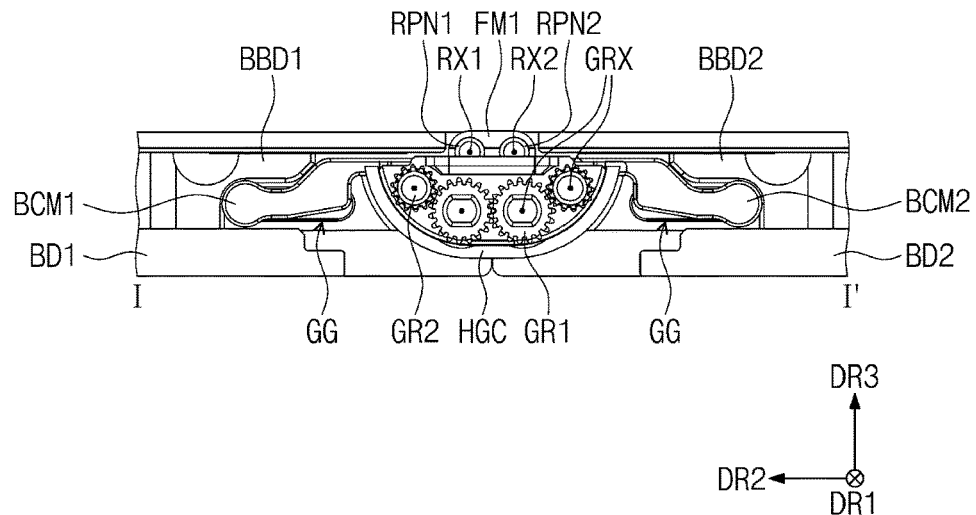
FIG. 22A is a cross-sectional view taken along a line I-I' shown in FIG. 18.
Figure 22B:
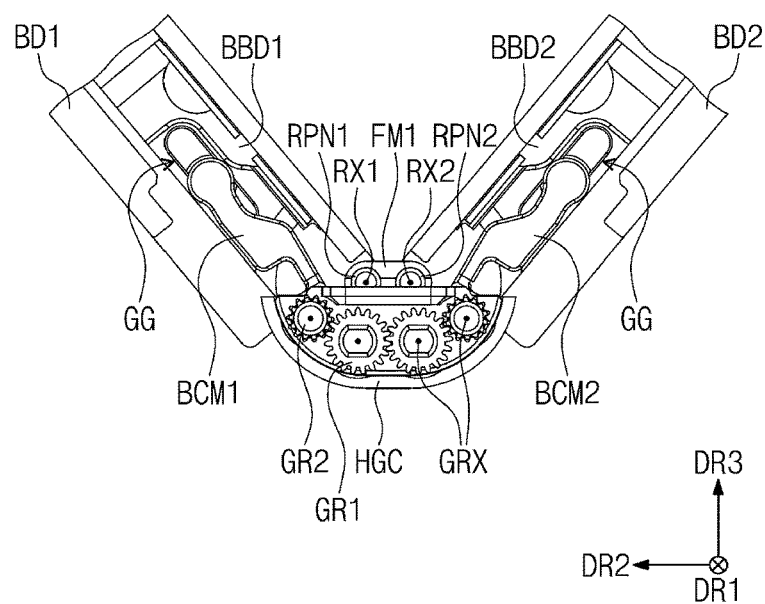
FIGS. 22B and 22C are cross-sectional views illustrating the folded state of the folding set shown in FIG. 22A.
Figure 22C:
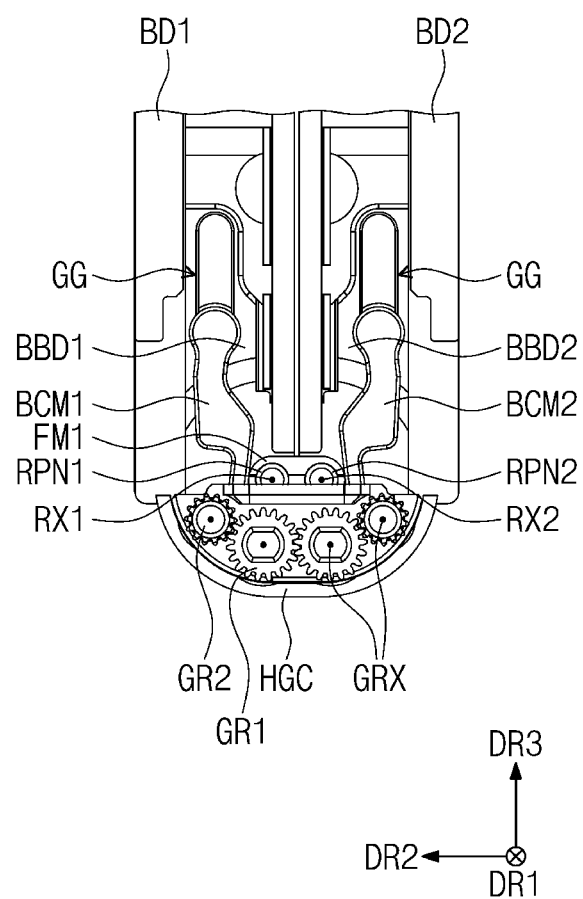

FIG. 22A is a cross-sectional view taken along a line I-I' shown in FIG. 18. FIGS. 22B and 22C are views illustrating the folded state of the folding set shown in FIG. 22A.

Hereinafter, descriptions will be made with reference to FIG. 18 when it is necessary.

Referring to FIGS. 18, 22A, 22B, and 22C, the first and second rotation pin units RPN1 and RPN2 may rotate with respect to the first and second rotation axes RX1 and RX2, and the folding set FST may be folded. As the first and second rotation pin units RPN1 and RPN2 rotate, the first and second bracket bodies BBD1 and BBD2 may rotate with respect to the first and second rotation axes RX1 and RX2 to move.

As the first and second bracket bodies BBD1 and BBD2 rotate, the first and second bodies BD1 and BD2 connected to the first and second bracket bodies BBD1 and BBD2 may rotate with respect to the first and second rotation axes RX1 and RX2. For example, the first and second rotation pin units RPN1 and RPN2 may provide the first and second rotation axes RX1 and RX2 to the first and second bodies BD1 and BD2, and the first and second bodies BD1 and BD2 may rotate with respect to the first and second rotation axes RX1 and RX2. The first body BD1 and the second body BD2 may face each other, and thus, the folding set FST may be inwardly folded.

The first and second gears GR1 and GR2 may be disposed lower than the first and second rotation pin units RPN1 and RPN2. When the first and second rotation pin units RPN1 and RPN2 rotate, the first and second gears GR1 and GR2 may rotate in conjunction with the first and second rotation pin units RPN1 and RPN2.

For example, the first and second bracket cams BCM1 and BCM2 connected to the first and second bracket bodies BBD1 and BBD2 may move due to the movement of the first and second bracket bodies BBD1 and BBD2 which rotate together with the first and second rotation pin units RPN1 and RPN2. The second gears GR2 that is coupled with the first and second bracket cams BCM1 and BCM2 may rotate due to the movement of the first and second bracket cams BCM1 and BCM2.

Due to the rotation of the second gears GR2, the first gears GR1 meshed with the second gears GR2 may rotate. For example, as the first and second bracket cams BCM1 and BCM2 rotate to move, the first and second gears GR1 and GR2 may rotate with the first and second bracket cams BCM1 and BCM2. The first and second gears GR1 and GR2 may rotate with respect to the gear rotation axes GRX that are substantially parallel to the first direction DR1 and defined at centers of the first and second gears GR1 and GR2 when viewed in the first direction DR1.

When the first and second bracket cams BCM1 and BCM2 rotate, one ends of the first and second bracket cams BCM1 and BCM2 may move along the guide grooves GG defined in the first and second bracket bodies BBD1 and BBD2. When the folding set FST is folded, the first and second bracket cams BCM1 and BCM2 and the first and second bracket bodies BBD1 and BBD2 may move relative to each other to be away from each other. As the first and second bracket cams BCM1 and BCM2 move along the guide grooves GG, the first and second bracket bodies BBD1 and BBD2 may more easily move.

Figure 23A:
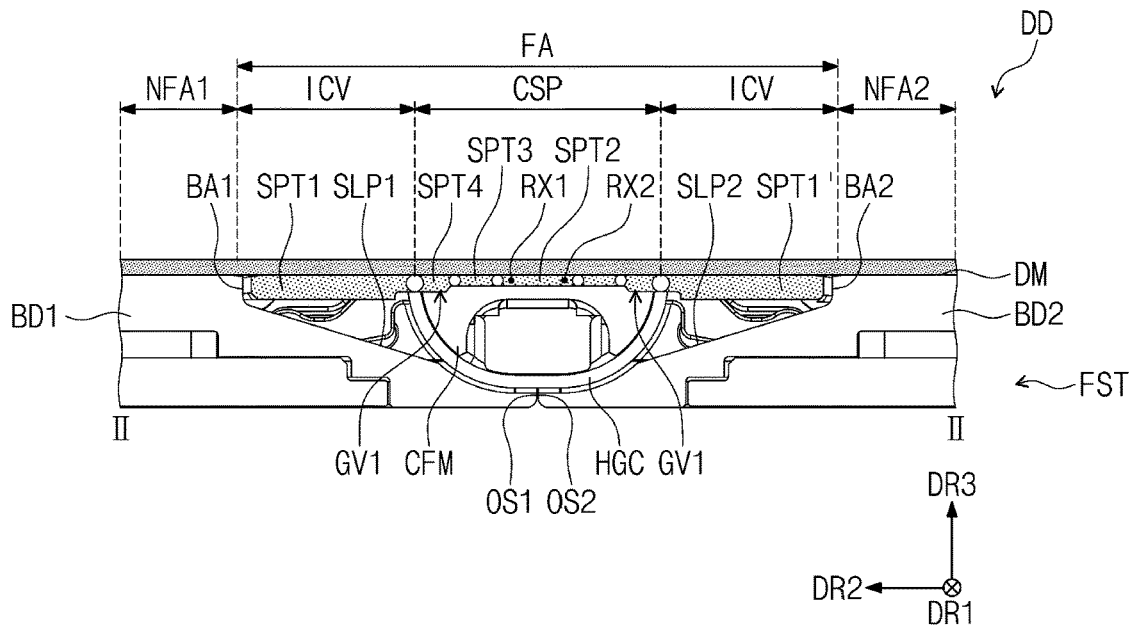
FIG. 23A is a cross-sectional view taken along a line II-II' shown in FIG. 18.
Figure 23B:
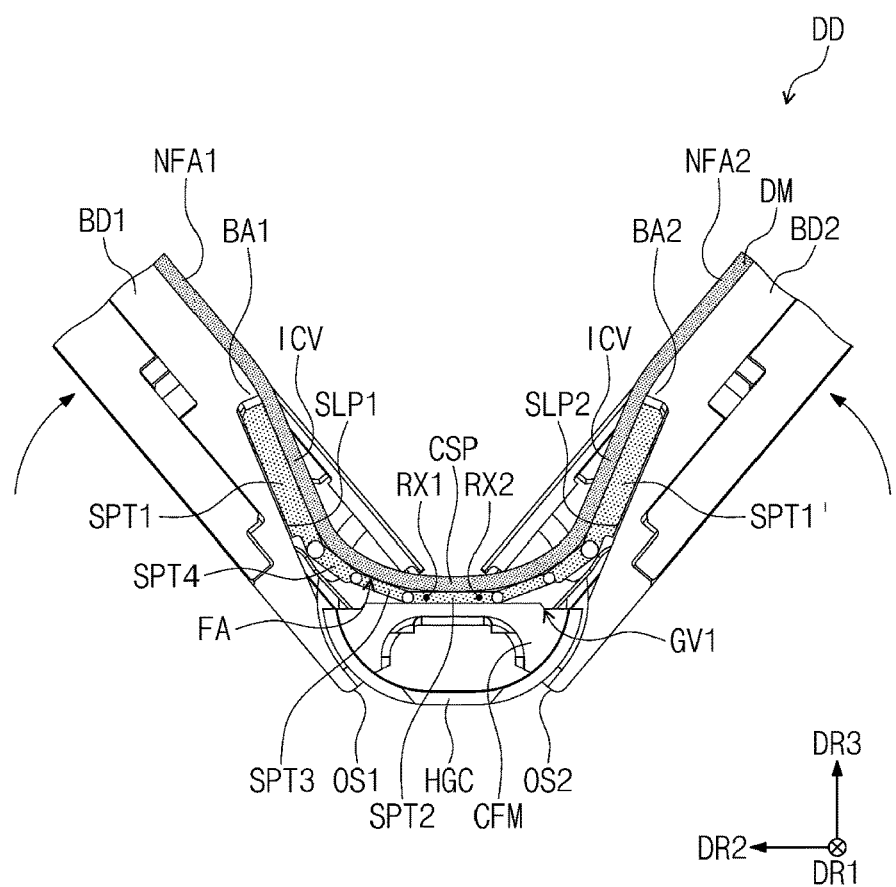
FIGS. 23B and 23C are cross-sectional views illustrating the folded state of the folding set shown in FIG. 23A.
Figure 23C:
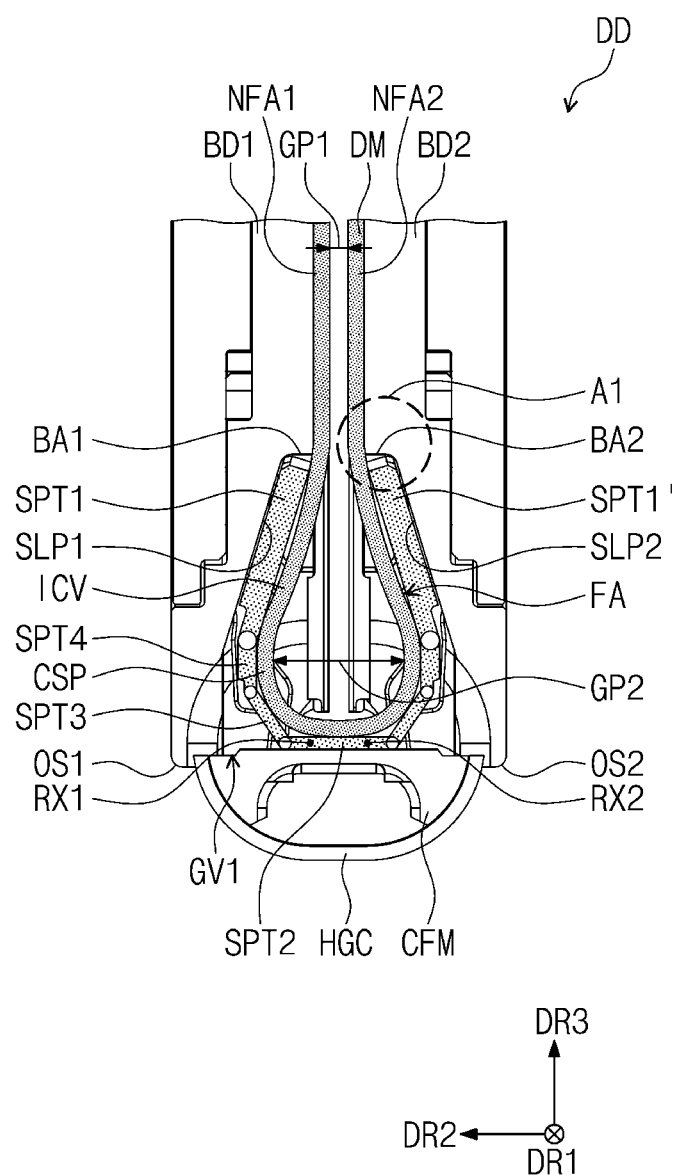

FIG. 23A is a cross-sectional view taken along a line II-II' shown in FIG. 18. FIGS. 23B and 23C are views illustrating the folded state of the folding set shown in FIG. 23A.

As an example, FIGS. 23A, 23B, and 23C show the display module DM together with the folding set FST to explain the folded state of the display module DM. In addition, FIGS. 23A, 23B, and 23C show the cross-sections obtained by additionally arranging the second, third, and fourth support plates SPT2, SPT3, and SPT4 to the configuration of FIG. 18.

Referring to FIG. 23A, the display module DM may be disposed on the folding set FST. The folding area FA may include a curved surface portion CSP and reverse curvature portions ICV. The reverse curvature portions ICV may be disposed between the curved surface portion CSP and the first non-folding area NFA1 and between the curved surface portion CSP and the second non-folding area NFA2.

The first body BD1 may be disposed under the first non-folding area NFA1, and the second body BD2 may be disposed under the second non-folding area NFA2. In a plan view, the first and second rotation axes RX1 and RX2 may overlap the folding area FA. The first rotation axis RX1 and the second rotation axis RX2 may be disposed lower than the upper surface of the display module DM.

The center frame CFM may be disposed under the folding area FA. The center frame CFM and the first and second frames FM1 and FM2 arranged in the first direction DR1 may be disposed under the folding area FA.

The first body BD1 and the second body BD2 may extend under the reverse curvature portions ICV and the curved surface portion CSP. The first body BD1 and the second body BD2 may be disposed adjacent to each other under the curved surface portion CSP in the second direction DR2.

The upper surfaces of the first and second bodies BD1 and BD2, which face the reverse curvature portions ICV, may be defined as the first slant surface SLP1 and the second slant surface SLP2, respectively. An upper surface of the first body BD1 disposed under the first support plate SPT1 may be formed as the first slant surface SLP1. An upper surface of the second body BD2 disposed under the first support plate SPT1' may be formed as the second slant surface SLP2. The first slant surface SLP1 and the second slant surface SLP2 may have a step difference with the upper surfaces of the first and second bodies BD1 and BD2 disposed under the first and second non-folding areas NFA1 and NFA2.

The support plates SPT may be disposed between the center frame CFM and the folding area FA. The first support plates SPT1 and SPT1' may be disposed between the first and second slant surfaces SLP1 and SPL2 and the reverse curvature portions ICV. The first support plates SPT1 and SPT1' may be disposed adjacent to the first boundary BA1 and the second boundary BA2, respectively.

The one side of the first support plate SPT1 and the one side of the first support plate SPT1', which face each other, may be disposed on both sides of the center frame CFM. The one side of the first support plate SPT1 and the one side of the first support plate SPT1', which face each other, may be disposed above the first grooves GV1 defined in both sides of the center frame CFM. The fourth support plates SPT4 may be disposed above the first grooves GV1.

The one side of the first support plate SPT1 and the one side of the first support plate SPT1' may be disposed above the second grooves GV2 defined in the second frame FM2. In addition, the fourth support plates SPT4 may also be disposed above the second grooves GV2.

Referring to FIGS. 23B and 23C, the folding set FST may be folded with respect to the first and second rotation axes RX1 and RX2, and thus, the display module DM may be folded. The folding area FA may be bent, and the display module DM may be folded. The display module DM may be inwardly folded such that the first non-folding area NFA1 and the second non-folding area NFA2 may face each other.

The curved surface portion CSP may be bent into a curved shape when the display module DM is folded. The curved surface portion CSP may be bent with a predetermined curvature. The reverse curvature portions ICV may be bent opposite to the curved surface portion CSP. The reverse curvature portions ICV may be bent symmetrically with respect to each other. Curvatures of the reverse curvature portions ICV may be different from a curvature of the curved surface portion CSP.

When the display module DM is folded, a first gap GP1 between the first non-folding area NFA1 and the second non-folding area NFA2 may be smaller than a second gap GP2 between boundaries defined between the curved surface portion CSP and the reverse curvature portions ICV due to the above-mentioned folding structure. Accordingly, when the display module DM is folded, the display module DM may be folded into a dumbbell shape.

When the folding area FA is in the unfolded state, the support plates SPT may be arranged in the second direction DR2 and may support the folding area FA. When the folding area FA is folded, the support plates SPT may rotate and may be arranged along the folding area FA. The support plates SPT may be arranged in the dumbbell shape as the folding area FA.

When the display module DM is folded, the first support plate SPT1 may move to the first slant surface SLP1 by a stress of the folding area FA and may be brought into contact with the first slant surface SLP1. In addition, due to the stress of the folding area FA, the first support plate SPT1' may move to the second slant surface SLP2 and may be in contact with the second slant surface SLP2.

When the folding area FA is folded, the support plates SPT may at least partially surround a lower surface of the folding area FA, which faces the support plates SPT. As the support plates SPT surround and protect the folding area FA, the curved surface portion CSP might not be in contact with the center frame CFM. The support plates SPT may be implemented in the form of a film including a non-metallic material, e.g., a plastic material. However, the present disclosure should not necessarily be limited thereto or thereby, and the support plates SPT may include a metal material.

Figure 24:
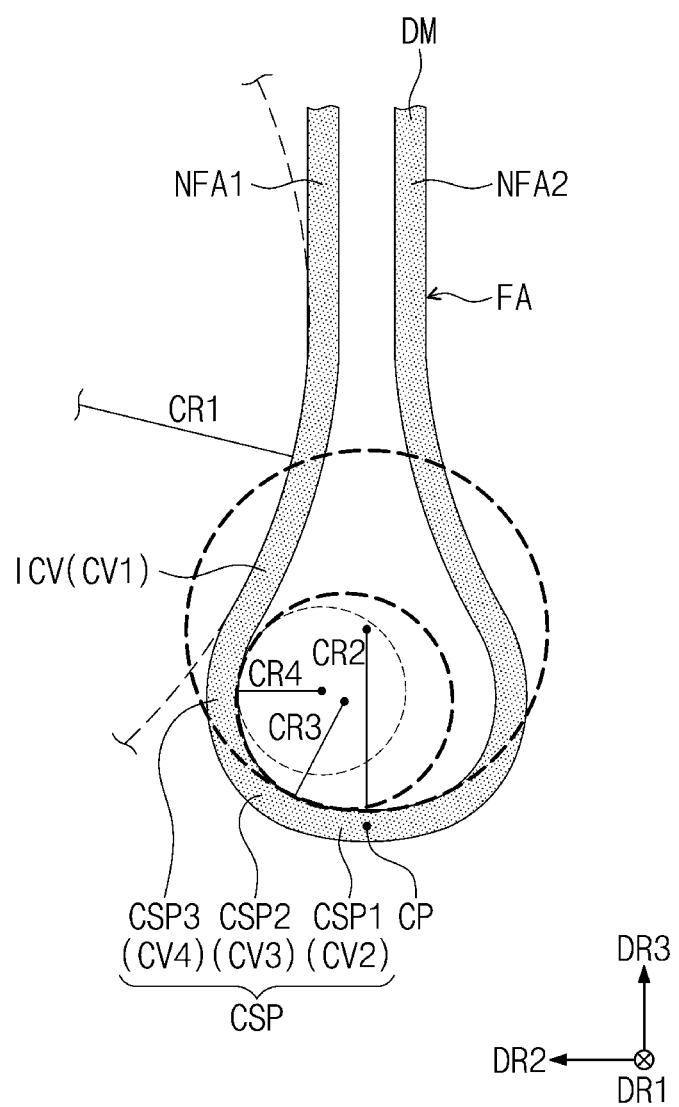
FIG. 24 is an enlarged view of a folded display module shown in FIG. 23C.

FIG. 24 is an enlarged view of the folded display module DM shown in FIG. 23C.

Referring to FIGS. 23C and 24, the folding area FA, which is curved along the support plates SPT, may include portions having different curvatures from each other. As an example, a first curvature CV1 of each of the reverse curvature portions ICV may be smaller than the curvature of the curved surface portion CSP.

The curvature may indicate a degree of being curved or bent, and a radius of curvature may be a radius of a circle defined by the curvature. The radius of curvature may be reciprocal to the curvature. As an example, as the curvature increases, the folding area FA may be greatly curved, and in this case, the radius of curvature may decrease. Additionally, as the curvature decreases, the folding area FA may be less and smoothly curved, and in this case, the radius of curvature may increase.

The curved surface portion CSP may include portions having different curvatures from each other. The curvature of the curved surface portion CSP may increase from a center the curved surface portion CSP to the boundaries between the reverse curvature portions ICV and the curved surface portion CSP. The center of the curved surface portion CSP may be defined as a center point CP of the curved surface portion CSP in the second direction DR2 when the curved surface portion CSP is unfolded.

The curved surface portion CSP may include a first curved surface portion CSP1, second curved surface portions CSP2, and third curved surface portions CSP3, which have different curvatures from each other.

The first curved surface portion CSP1 may be defined as a center portion of the curved surface portion CSP. A center point of the first curved surface portion CSP1 may be defined as the center point CP. The second curved surface portions CSP2 may be disposed between the reverse curvature portions ICV and the first curved surface portion CSP1. The third curved surface portions CSP3 may be disposed between the reverse curvature portions ICV and the second curved surface portion CSP2.

A first radius of curvature CR1 may be defined by the first curvature CV1. The first curvature CV1 may be smaller than a second curvature CV2 of the first curved surface portion CSP1. The first radius of curvature CR1 may be greater than a second radius of curvature CR2 defined by the second curvature CV2.

The second curvature CV2 may be smaller than a third curvature CV3 of each of the second curved surface portions CSP2. The second radius of curvature CR2 may be greater than a third radius of curvature CR3 defined by the third curvature CV3.

The third curvature CV3 may be smaller than a fourth curvature CV4 of each of the third curved surface portions CSP3. The third radius of curvature CR3 may be greater than a fourth radius of curvature CR4 defined by the fourth curvature CV4.

Figure 25:
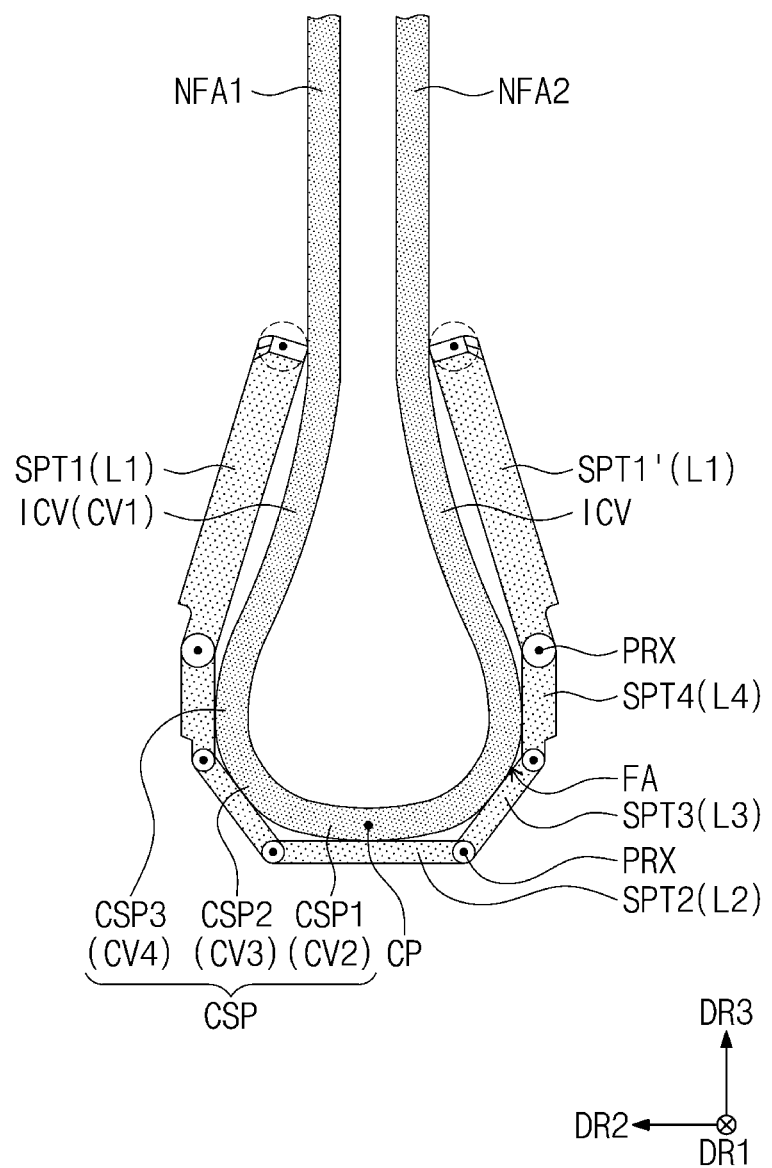
FIG. 25 is an enlarged view of the folded display module and the support plates shown in FIG. 23C.

FIG. 25 is an enlarged view of the folded display module and the support plates shown in FIG. 23C.

Hereinafter, descriptions will be made with reference to FIGS. 13 and 24 when it is necessary.

Referring to FIGS. 13, 24, and 25, the first support plates SPT1 and SPT1' may be disposed adjacent to the reverse curvature portions ICV, respectively. The second, third, and fourth support plates SPT2, SPT3, and SPT4 may be disposed adjacent to the curved surface portion CSP. The second support plate SPT2 may be disposed adjacent to the first curved surface portion CSP1. The third support plates SPT3 may be disposed adjacent to the second curved surface portions CSP2, respectively. The fourth support plates SPT4 may be disposed adjacent to the third curved surface portions CSP3, respectively.

Hereinafter, lengths L1, L2, L3, and L4 of the support plates SPT shown in FIGS. 24 and 25 may indicate lengths in the second direction DR2 of the support plates SPT of FIG. 13.

The lengths L1 to L4 of the support plates SPT may increase as the curvature of the folding area FA decreases. As an example, the first curvature CV1 may be smaller than the second, third, and fourth curvatures CV2, CV3, and CV4. Accordingly, the first lengths L1 of the first support plates SPT1 and SPT1' adjacent to the reverse curvature portions ICV may be greater than the second, third, and fourth lengths L2, L3, and L4 of the second, third, and fourth support plates SPT2, SPT3, and SPT4 adjacent to the curved surface portion CSP.

Due to the second, third, and fourth curvatures CV2, CV3, and CV4 of the curved surface portion CSP, the length of the support plates SPT may decrease as it goes from the center of the curved surface portion CSP to the boundaries between the reverse curvature portions ICV and the curved surface portion CSP.

As an example, the second curvature CV2 may be smaller than the third curvature CV3, and the third curvature CV3 may be smaller than the fourth curvature CV4. Accordingly, the second length L2 of the second support plate SPT2 adjacent to the first curved surface portion CSP1 may be greater than the third lengths L3 of the third support plates SPT3 adjacent to the second curved surface portions CSP2. The third length L3 of each of the third support plates SPT3 adjacent to the second curved surface portions CSP2 may be greater than the fourth lengths L4 of the fourth support plates SPT4 adjacent to the fourth curved surface portions CSP4.

Since the support plates SPT have different lengths according to the curvatures CV1 to CV4 of the folding area FA, the support plates SPT may be appropriately placed depending on the degree of curve of the folding area FA.

A distance between the rotation axes PRX defined in both sides of each of the support plates SPT may be differently set depending on the curvature of the folding area FA. As an example, the distance between the rotation axes PRX of each of the support plates SPT may increase as the curvature of the folding area FA decreases.

A distance between the rotation axes PRX of each of the first support plates SPT1 and SPT1' may be greater than a distance between the rotation axes PRX of the second support plate SPT2. The distance between the rotation axes PRX of the second support plate SPT2 may be greater than a distance between the rotation axes PRX of each of the third support plates SPT3. The distance between the rotation axes PRX of each of the third support plates SPT3 may be greater than a distance between the rotation axes PRX of each of the fourth support plates SPT4.

According to the present disclosure, when the folding area FA is folded, the lengths of the support plates SPT may be differently set according to the curvature of the folding area FA, and thus, the support plates SPT may surround the lower surface of the folding area FA. Accordingly, the support plates SPT may be easily folded with the folding area FA and may protect the folding area FA.

Figure 26A:
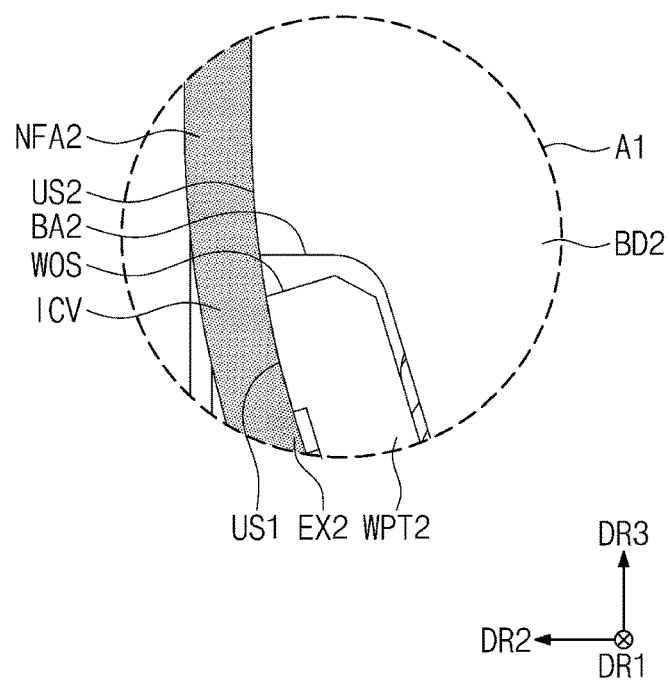
FIG. 26A is an enlarged view of a first area A1 of FIG. 23C.
Figure 26B:
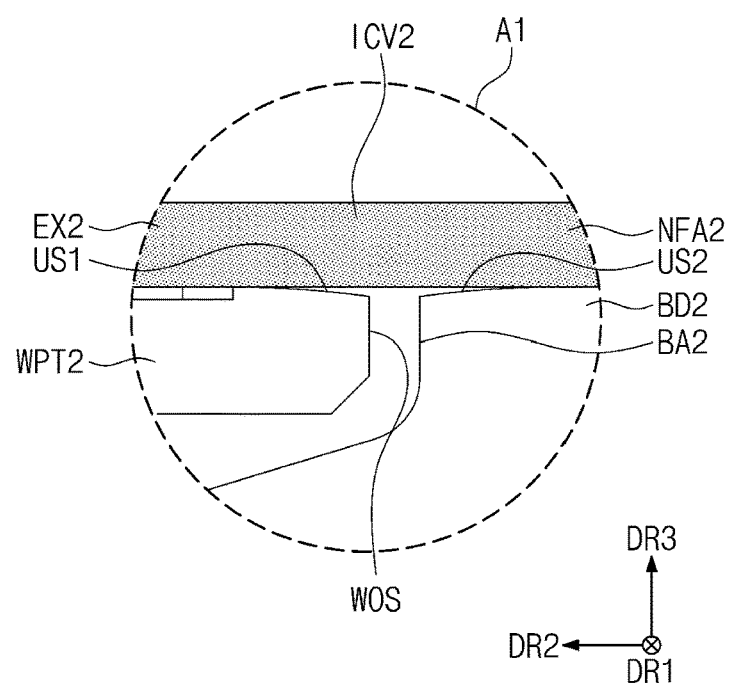
FIG. 26B is an enlarged view of an unfolded state of a reverse curvature portion shown in FIG. 26A.

FIG. 26A is an enlarged view of a first area A1 of FIG. 23C, and FIG. 26B is a view of an unfolded state of the reverse curvature portion shown in FIG. 26A.

As an example, FIGS. 26A and 26B show configurations surrounding one reverse curvature portion ICV, and configurations surrounding the other reverse curvature portion may be substantially the same as the configurations surrounding the reverse curvature portion ICV shown in FIGS. 26A and 26B.

Referring to FIGS. 26A and 26B, the upper surface of the second body BD2 and the upper surface of the first support plate SPT1', which are adjacent to each other, may include a curved surface. As an example, a first upper surface US1 of the first support plate SPT1' adjacent to the second boundary BA2 and a second upper surface US2 of the second body BD2 disposed under the second non-folding area NFA2 and adjacent to the second boundary BA2 may include the curved surface. One side WOS of a second wing plate WPT2 adjacent to the second boundary BA2 and the second boundary BA2 may be disposed adjacent to a center of a second reverse curvature portion ICV.

As shown in FIG. 26A, when the display module DM is folded, the second reverse curvature portion ICV may be in contact with the first and second upper surfaces US1 and US2 and may be curved. The curved surface of the first upper surface US1 and the curved surface of the second upper surface US2 may correspond to the curved surface of the reverse curvature portion ICV. As the first and second upper surfaces US1 and US2 include the curved surfaces, the second reverse curvature portion ICV may be easily curved along the first and second upper surfaces US1 and US2.

Although the embodiments of the present disclosure have been described, it is understood that the present disclosure should not necessarily be limited to these embodiments but various changes and modifications can be made to the disclosed embodiments by one ordinary skilled in the art within the spirit and scope of the present disclosure.

What is claimed is:
1. A display device, comprising:
 a display module comprising a folding area that is foldable with respect to a folding axis that extends in a first direction and first and second non-folding areas extended in a second direction crossing the first direction with the folding area interposed between the first non-folding area and the second non-folding area;
 a first body disposed under the first non-folding area;
 a second body disposed under the second non-folding area;
 a center body disposed under the folding area; and
 a plurality of support plates, each extending in the first direction, arranged in the second direction, disposed between the center body and the folding area, and rotatably coupled with each other,
 wherein lengths in the second direction of each of the plurality of support plates, as measured in an unfolded state of the display device, increase as a curvature of the folding area, as measured in a folded state of the display device, decreases.

2. The display device of claim 1, wherein the plurality of support plates at least partially surround a lower surface of the folding area, which faces the plurality of support plates, when the folding area is in a folded state.

3. The display device of claim 1, wherein support plates, of the plurality of support plates, that are closest to the first and second bodies are rotatably coupled to the first and second bodies.

4. The display device of claim 3, wherein a distance between rotation axes extending in the first direction and defined in both sides of each of the plurality of support plates, which are opposite to each other in the second direction, increases as the curvature of the folding area decreases.

5. The display device of claim 1, wherein the folding area comprises:
a curved surface portion bent in a curved line shape; and
reverse curvature portions respectively disposed between the first non-folding area and the curved surface portion and between the second non-folding area and the curved surface portion, bent symmetrically with respect to each other, and bent opposite to the curved surface portion.

6. The display device of claim 5, wherein a gap between the first and second non-folding areas is smaller than a gap between boundaries defined between the curved surface portion and the reverse curvature portions.

7. The display device of claim 5, wherein each of the reverse curvature portions has a curvature that is smaller than a curvature of the curved surface portion.

8. The display device of claim 5, wherein each of the support plates, of the plurality of support plates, that is closest to the reverse curvature portions has a length that is greater than a length of each of the support plates, of the plurality of support plates, that is closest to the curved surface portion.

9. The display device of claim 5, wherein the curved surface portion has a curvature that increases from a center of the curved surface portion to boundaries between the reverse curvature portions and the curved surface portion.

10. The display device of claim 5, wherein the lengths of the support plates, of the plurality of support plates, closest to the curved surface portion decrease as from a center of the curved surface portion to boundaries between the reverse curvature portions and the curved surface portion.

11. The display device of claim 5, wherein the curved surface portion comprises:
a first curved surface portion disposed at a center portion of the curved surface portion;
second curved surface portions respectively disposed between the reverse curvature portions and the first curved surface portion; and
third curved surface portions respectively disposed between the reverse curvature portions and the second curved surface portion.

12. The display device of claim 11, wherein a first curvature of each of the reverse curvature portions is smaller than a second curvature of the first curved surface portion, the second curvature is smaller than a third curvature of each of the second curved surface portions, and the third curvature is smaller than a fourth curvature of each of the third curved surface portions.

13. The display device of claim 11, wherein each of the plurality of support plates comprise:
first support plates closest to the reverse curvature portions and having a first length in the second direction;
a second support plate closest to the first curved surface portion and having a second length that is smaller than the first length in the second direction;
third support plates closest to the second curved surface portions and having a third length that is smaller than the second length in the second direction; and
fourth support plates closest to the third curved surface portions and having a fourth length that is smaller than the third length in the second direction.

14. The display device of claim 13, wherein the first and second bodies respectively extend under the reverse curvature portions, upper surfaces of the first and second bodies respectively facing the reverse curvature portions comprise slant surfaces, the slant surfaces have a step difference with respect to the upper surfaces of the first and second bodies disposed in the first and second non-folding areas, and the slant surfaces have heights that are decreasing as a distance from one side of each of the first and second bodies, which face each other, decreases.

15. The display device of claim 14, wherein the first support plates are disposed on the slant surfaces.

16. The display device of claim 14, wherein the first support plates are rotatably coupled with rotation surfaces defined at boundaries between the slant surfaces and the upper surfaces of the first and second bodies.

17. The display device of claim 14, wherein the center body further comprises a center frame disposed between the first support plates in the second direction and one sides of the first support plates, which face each other, and the fourth support plates are disposed in grooves defined in upper portions of both sides of the center frame, which are opposite to each other in the second direction.

18. A display device, comprising:
a display module comprising a folding area that is foldable with respect to a folding axis extending in a first direction and first and second non-folding areas arranged in a second direction crossing the first direction with the folding area interposed between the first non-folding area and the second non-folding area;
a first body disposed under the first non-folding area;
a second body disposed under the second non-folding area;
a center body disposed under the folding area; and
a plurality of support plates each extending in the first direction, arranged in the second direction, disposed between the center body and the folding area, and rotatably coupled with each other, wherein a distance between rotation axes extending in the first direction and defined in both sides of each of the plurality of support plates, which are opposite to each other in the second direction, as measured in an unfolded state of the display device, increases as a curvature of the folding area decreases, as measured in a folded state of the display device.

19. The display device of claim 18, wherein the folding area comprises:
a curved surface portion bent in a curved line shape; and
reverse curvature portions respectively disposed between the first non-folding area and the curved surface portion and between the second non-folding area and the curved surface portion, bent symmetrically with respect to each other, and bent opposite to the curved surface portion, a length of each of the support plates adjacent to the reverse curvature portions is greater than a length of each of the plurality of support plates adjacent to the curved surface portion, and the length of the support plates, of the plurality of support plates, closest to the curved surface portion decreases as it goes from a center of the curved surface portion to boundaries between the curved surface portion and the reverse curvature portions.

20. An electronic device including a display device that comprises:
a display module comprising a folding area that is foldable with respect to a folding axis substantially extending in a first direction and first and second non-folding areas arranged in a second direction crossing the first direction with the folding area interposed between the first non-folding area and the second non-folding area;
a first body disposed under the first non-folding area;
a second body disposed under the second non-folding area;
a center body disposed under the folding area; and
a plurality of support plates extending in the first direction, arranged in the second direction, disposed between the center body and the folding area, and rotatably coupled with each other, wherein lengths in the second direction of each of the plurality of support plates, as measured in an unfolded state of the display device, are different from each other.

* * * * *